United States Patent [19]
Ono et al.

[11] Patent Number: 5,334,854
[45] Date of Patent: Aug. 2, 1994

[54] OPTICAL SEMICONDUCTOR DEVICE WITH WAVELENGTH SELECTIVITY AND METHOD FOR AMPLIFYING OR EMITTING THE LIGHT USING THE SAME

[75] Inventors: Takeo Ono; Masahiro Okuda, both of Sagamihara, Japan

[73] Assignee: Canon Kabushiki Kaisha, Tokyo, Japan

[21] Appl. No.: 727,128

[22] Filed: Jul. 9, 1991

[30] Foreign Application Priority Data

Jul. 11, 1990 [JP] Japan .................. 2-183388

[51] Int. Cl.$^5$ .............................. H01L 33/00
[52] U.S. Cl. ............................ 257/13; 257/21; 257/96; 257/97; 257/197; 372/45; 372/46; 372/48; 372/50
[58] Field of Search ............ 357/17, 16, 4, 58; 372/50, 45, 46, 48; 257/21, 13, 197, 95, 96, 97

[56] References Cited

U.S. PATENT DOCUMENTS

| | | | |
|---|---|---|---|
| 5,038,185 | 8/1991 | Thornton | 372/45 X |
| 5,157,680 | 10/1992 | Goto | 372/50 |

FOREIGN PATENT DOCUMENTS

| | | |
|---|---|---|
| 0296066 | 12/1988 | European Pat. Off. . |
| 2296066 | 12/1988 | European Pat. Off. . |
| 0360011 | 8/1989 | European Pat. Off. . |
| 2360011 | 3/1990 | European Pat. Off. . |
| 2404551 | 6/1990 | European Pat. Off. . |
| 0404551 | 12/1990 | European Pat. Off. . |
| 1070724 | 3/1989 | Japan . |
| 6470724 | 3/1989 | Japan . |

OTHER PUBLICATIONS

Numai et al., "Tunable Wavelength Filter Using Phase-Shift Controllable DFB LD," Opto-Electronics Research Laboratories, NEC Corporation, C-161, 1988, p. 63.

"Quantum-confined field-effect wavelength tuning in a three-terminal double quantum well laser," by F. Y. Huang, Applied Physics Letters, vol. 56, No. 23, pp. 2282–2284 (Jun. 4, 1990).

"Tunable Infrared Modulator and Switch Using Stark Shift in Step Quantum Wells," by R. P. G. Karunasiri et al., IEEE Electron Devices Letters, vol. 11, No. 5, pp. 227–229 (May 11, 1990).

"565 Mbit/s 219km transmission experiment using four gain controlled packaged semiconductor laser amplifiers," by A. D. Ellis et al., Electronics Letters, vol. 26, No. 6, pp. 385–387 (Mar. 15, 1990).

"Quadratic electro-optic effect due to the quantum-confined Stark effect on quantum wells", Joseph S. Weiner, et al., Appln. Phys. Lett. 50 (13), Mar. 30, 1987, pp. 842–844.

*Primary Examiner*—William Mintel
*Attorney, Agent, or Firm*—Fitzpatrick, Cella, Harper & Scinto

[57] ABSTRACT

An optical semiconductor device with wavelength selectivity comprises a substrate, a collector layer provided on said substrate and composed of a semiconductor having a first conductive type, a multiple quantum well layer provided on said collector layer, a base layer provided on said multiple quantum well layer and composed of a semiconductor having a second conductive type, said base layer consisting of an active layer, and first and second semiconductor layers with said active layer sandwiched therebetween and having a wider band gap than said active layer, said base layer and said multiple quantum well layer propagating light, an emitter layer provided on said base layer and composed of a semiconductor having the first conductive type, and a collector electrode, a base electrode and an emitter electrode electrically connected to said collector layer, base layer and emitter layer, respectively.

72 Claims, 16 Drawing Sheets

FIG. 6a
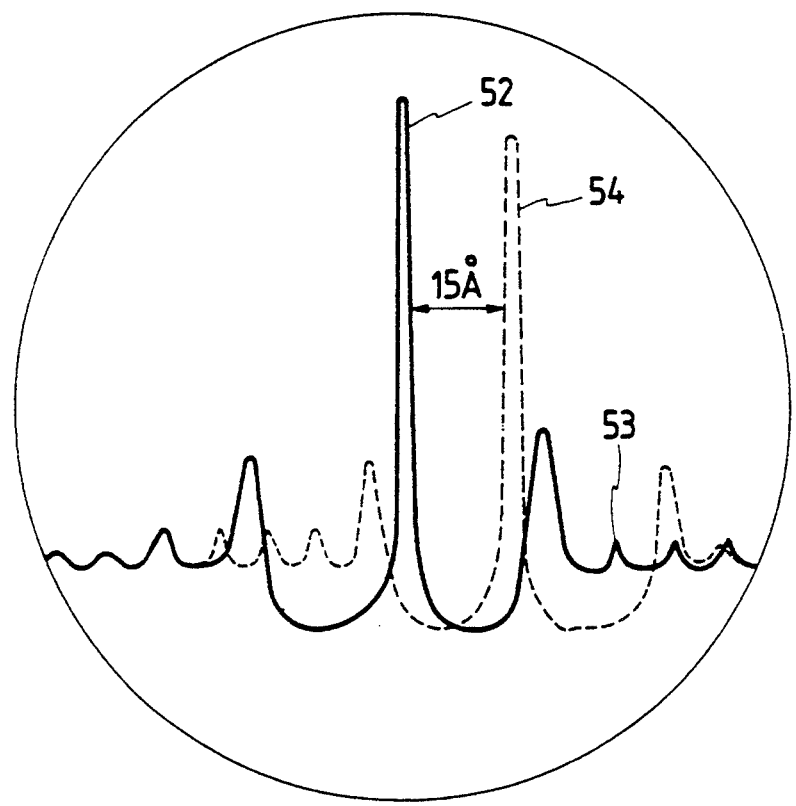
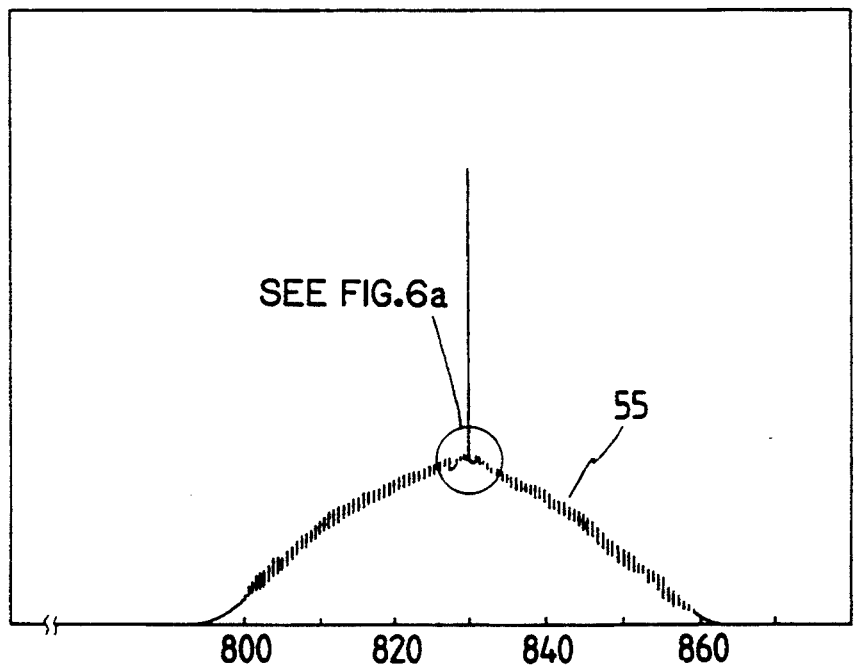
FIG. 6

OPTICAL SEMICONDUCTOR DEVICE WITH WAVELENGTH SELECTIVITY AND METHOD FOR AMPLIFYING OR EMITTING THE LIGHT USING THE SAME

BACKGROUND OF THE INVENTION

1. Field of the Invention

The present invention relates to an optical semiconductor device with wavelength selectivity for use as an optical amplifier or laser light source, and a method for amplifying or emitting the light using that device.

2. Related Background Art

Recently, optical communication has been vigorously studied and developed because of its large capacity and the ability of high-speed communication.

To obtain a larger capacity and a higher speed, the technology is transferring to wavelength multiplexing optical communication. Thus, there are needs of a laser light source for emitting light having different wavelengths, and a filter for selecting its wavelength, wherein if the light source is an ordinary semiconductor laser, the variable width of wavelength becomes about 100 Å, and if the wavelength multiplexing is made in this range, there are needs of a single mode laser light source having a wavelength spectral band width of 1 Å, and a filter for selecting the wavelength with a resolution of 2 to 3 Å.

From this point of view, there have been proposed as having the greatest possibility in current application a laser light source of the distributed feedback (DFB) or distributed Bragg reflection type (DBR), and a waveguide filter formed with a distributed reflection portion.

FIG. 1 is a schematic perspective view illustrating one example of a conventional waveguide filter as proposed by Numai et al., in "Tunable wavelength filter using the phase shift control type DFB-LD," Electronic Information Communication Society, Autumn Nationwide Meeting, treatises C-161, 1988.

A filter of FIG. 1 is provided with a grating 82 on a waveguide layer 81, and three divided electrodes 83, 83', 84 formed along a waveguide direction, in which electrodes 83, 83' on both ends have gains, and different refractive indexes varies with the densities of the carrier, respectively, with the distributed reflection wavelength being changed by the grating. A central electrode 84 also controls the refractive index with the variation of carrier density, so that the phase of light passing through a waveguide may be changed to be able to select a wider range of wavelengths.

With the filter as shown in FIG. 1, however, there is a disadvantage that the change of refractive index may be suppressed due to the temperature elevation caused by the current flowing through a waveguide layer. Also, since an active area and a phase adjustment area are provided separately, as shown in FIG. 1, problems may arise, such as the coupling between respective areas and the occurrence of a composite resonator due to reflection at an end face where the active layer is removed. Accordingly, to overcome these problems, disadvantages could not be avoided such that the design of device became complex, and the device would be fabricated with a bad yield.

SUMMARY OF THE INVENTION

An object of the present invention is to resolve the above-described prior art problems, and to provide an optical semiconductor device which has a variable wide range of selective wavelengths and is easy to design, and a method for amplifying and emitting the light using the same.

According to a first embodiment of the present invention for attaining the above object, there is provided an optical semiconductor device with wavelength selectivity comprising a substrate. A collector layer is provided on the substrate and is composed of a semiconductor having a first conductive type. A multiple quantum well layer is provided on the collector layer. A base layer is provided on the multiple quantum well layer and is composed of a semiconductor having a second conductive type, the base layer consisting of an active layer, and first and second semiconductor layers with the active layer sandwiched therebetween and having a wider band gap than the active layer, the base layer and the multiple quantum well layer propagating the light. An emitter layer is provided on the base layer and is composed of a semiconductor having the first conductive type. A collector electrode, a base electrode and an emitter electrode are electrically connected to the collector layer, the base layer and the emitter layer, respectively.

Also, there is provided a method of amplifying a light of a selected wavelength using the optical semiconductor device in the above first embodiment, comprising steps of entering the light into a waveguide constituted of a multiple quantum well layer and a base layer; propagating the incident light through the waveguide; amplifying the light of the selected wavelength among the light propagating through the waveguide by applying an electric field of forward bias between an emitter electrode and a base electrode; emitting the amplified light from the device; and changing the wavelength of said amplified light by applying an electric field of reverse bias between the base electrode and the collector electrode.

Also, there is disclosed a method of emitting a laser beam of a selected wavelength from the optical semiconductor device according to the above first embodiment, comprising the steps of emitting the laser beam of the selected wavelength from the device by applying an electric field of forward bias between an emitter electrode and a base electrode, and supplying a current to an active layer; and changing the wavelength of the laser beam emitted therefrom by applying an electric field of reverse bias between the base electrode and the collector electrode.

According to a second embodiment of the present invention, there is provided an optical semiconductor device with wavelength selectivity, comprising a substrate. A semiconductor active layer is provided on the substrate and has a first conductor type. First and second semiconductor layers of the first conductive type are provided with the active layer sandwiched therebetween and having a wider band gap than the active layer. A multiple quantum well layer is provided adjacent to the first semiconductor layer, wherein the active layer, the multiple quantum well layer and the first and second semiconductor layers constitute an optical waveguide. Third and fourth semiconductor layers are provided with the optical waveguide sandwiched therebetween and having a second conductive type. A first electrode, a second electrode and a third electrode are electrically connected to the second semiconductor layer, the third semiconductor layer and the fourth semiconductor layer, respectively.

Also, there is provided a method of amplifying a light of a selected wavelength using the optical semiconductor device according to the above second embodiment, comprising the steps of entering the light into an optical waveguide; propagating the incident light through the waveguide; amplifying the light of selected wavelength among the light propagating through the waveguide by applying an electric field of forward bias between the first electrode and the third electrode; emitting the amplified light from the device; and changing the wavelength of the amplified light by applying an electric field of reverse bias between the first electrode and the second electrode.

Also, there is disclosed a method of emitting a laser beam of selected wavelength from the optical semiconductor device according to the above second embodiment, comprising steps of emitting the laser beam of a selected wavelength from the device by applying an electric field of forward bias between the first electrode and the third electrode, and supplying a current to the active layer; and changing the wavelength of the laser beam emitted therefrom by applying an electric field of reverse bias between the first electrode and the second electrode.

BRIEF DESCRIPTION OF THE DRAWINGS

FIG. 6 is a diagram showing the emitted light spectra in the second example.

DESCRIPTION OF THE PREFERRED EMBODIMENTS

Figure 1:
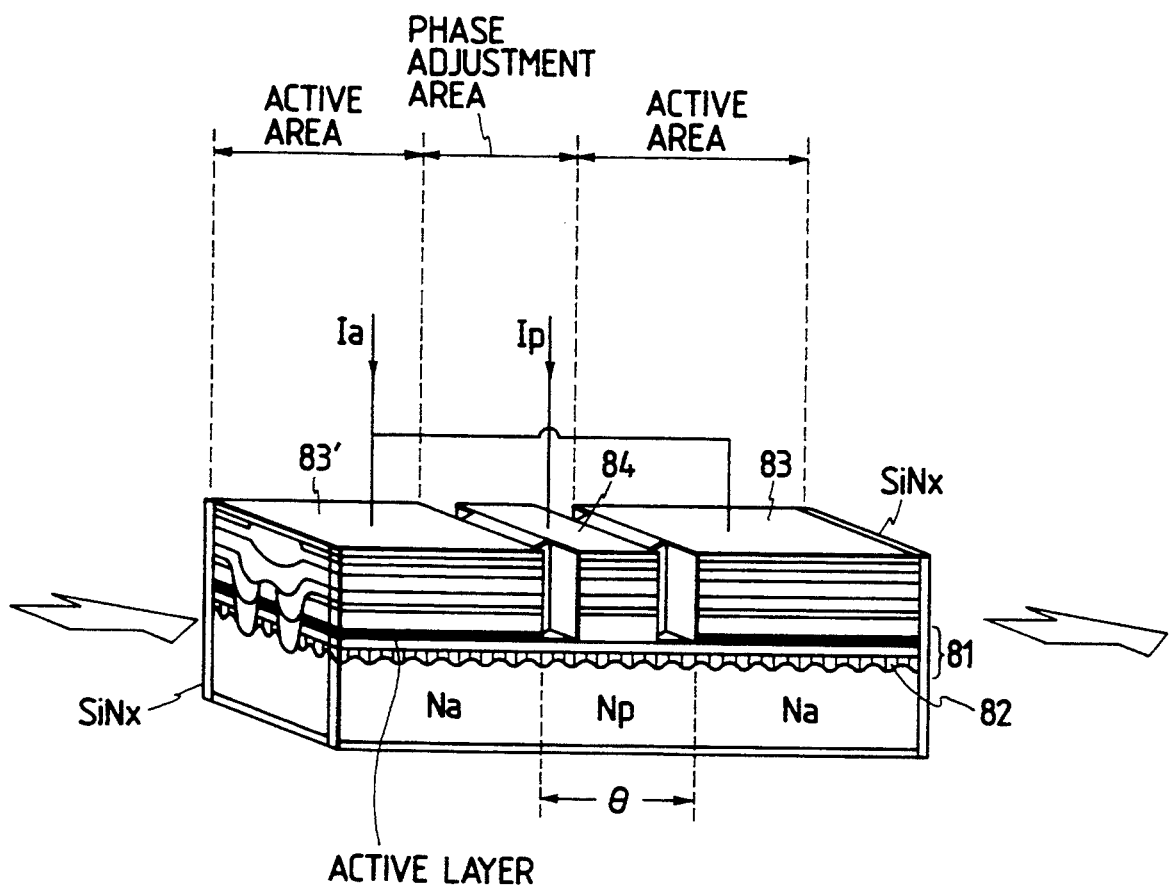
FIG. 1 is a schematic perspective view showing a conventional variable wavelength filter.
Figures 2A, 2B:
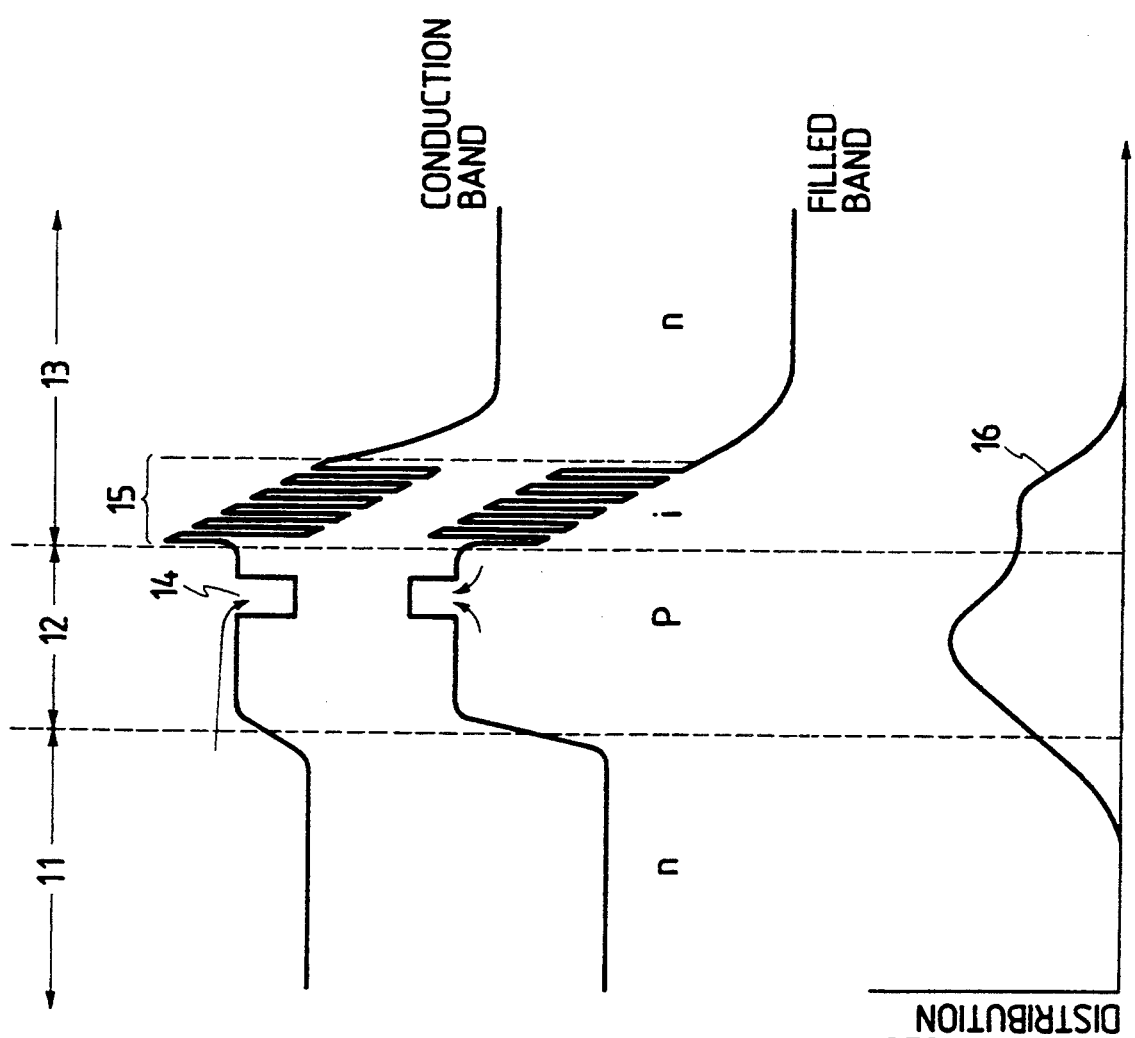
FIGS. 2A and 2B are diagrams showing an energy band in the neighborhood of an optical waveguide for an optical semiconductor device according to the present invention, and an electric field distribution of waveguide light, respectively.

FIG. 2A is an energy band diagram in the neighborhood of an optical waveguide of an optical semiconductor device according to the present invention. The device of the present invention has a hetero bipolar transistor structure consisting of an emitter area 11, a base area 12 and a collector area 13. FIG. 2A shows the energy bands in applying an electric field of forward bias between the emitter and the base, and applying an electric field of reverse bias between the base and the collector. FIG. 2B is a diagram showing an electric field strength distribution for waveguide light in the optical semiconductor device of the present invention.

In FIG. 2A, reference numeral 14 is an active layer having a narrow band gap formed in a base area, and reference numeral 15 is a multiple quantum well layer provided in the neighborhood of the active area 14, in which a semiconductor area having a sufficiently larger band gap than the base area 12 is arranged in the neighborhood of the base area 12 so that carriers stored in the base area 12 do not flow into the collector area 13. When a semiconductor of GaAs or AlGaAs is used as the forming material for each area, the waveguide light is mainly confined in the base area 12 because the refractive index of the base area 12 having a narrow energy gap, or a relatively small mixed crystal ratio of Al, becomes high. Therefore, the electric field distribution of light is as shown in FIG. 2B, with a part of the waveguide light propagating through both of the active layer 14 and the multiple quantum well layer 15.

Here, as the forward bias is applied between the emitter area 11 composed of an n-type semiconductor and the base area 12 composed of a p-type semiconductor, electrons will flow from the emitter area 11 into the base area 12, and emit the light by recombination with holes in the active area 14 having a narrow energy gap. Accordingly, when the device of the present invention is used as a light amplifier or filter, the incident light can be amplified, if the energy gap of the active layer 14 is set in accordance with the wavelength of the incident light, with injection carriers due to the above forward bias suppressed below a threshold. Also, when it is used as a laser light emitting device, the effective oscillation can be made by setting the wavelength at which the gain of the active layer 14 is maximum to be in an appropriate relation with the resonant or Bragg wavelength. These will be further described in detail in the following example.

On the other hand, when the exciton wavelength in the electron ground level of multiple quantum well layer 15 and heavy hole is shorter by 100 to 150 Å than the wavelength of incident light, and the width of quantum well is about 70 to 120 Å, the quantum confinement stack effect (QCSE) will occur effectively by applying an electric field of reverse bias between the collector area 13 and the base area 12, whereby the quantum level face gap is changed, so that the refractive index of multiple quantum well layer 15 is largely changed. Hence, the propagation constant of the waveguide is greatly varied, thereby causing the resonant or Bragg wavelength to be changed, so that the oscillated light or the filtered wavelength can be made variable.

Here, when the wavelength of waveguide light is longer than the exciton wavelength of multiple quantum well layer 15, the refractive index variation caused by the leakage owing to injection current and that caused by QCSE have the same polarity. Therefore, the device according to the present invention can change the refractive index more than a conventional device in which the above two refractive index variations are offset, so that the selective wavelength can be provided in a wide area.

Also, with a constitution of the present invention, as it is not necessary to change the layer constitution of waveguide in a direction of guiding the light, the design of device can be made easier, and moreover, the length of device can be made shorter than a conventional one, because it is not necessary to provide a plurality of electrodes separated in a longitudinal direction of the waveguide.

Figure 3A:
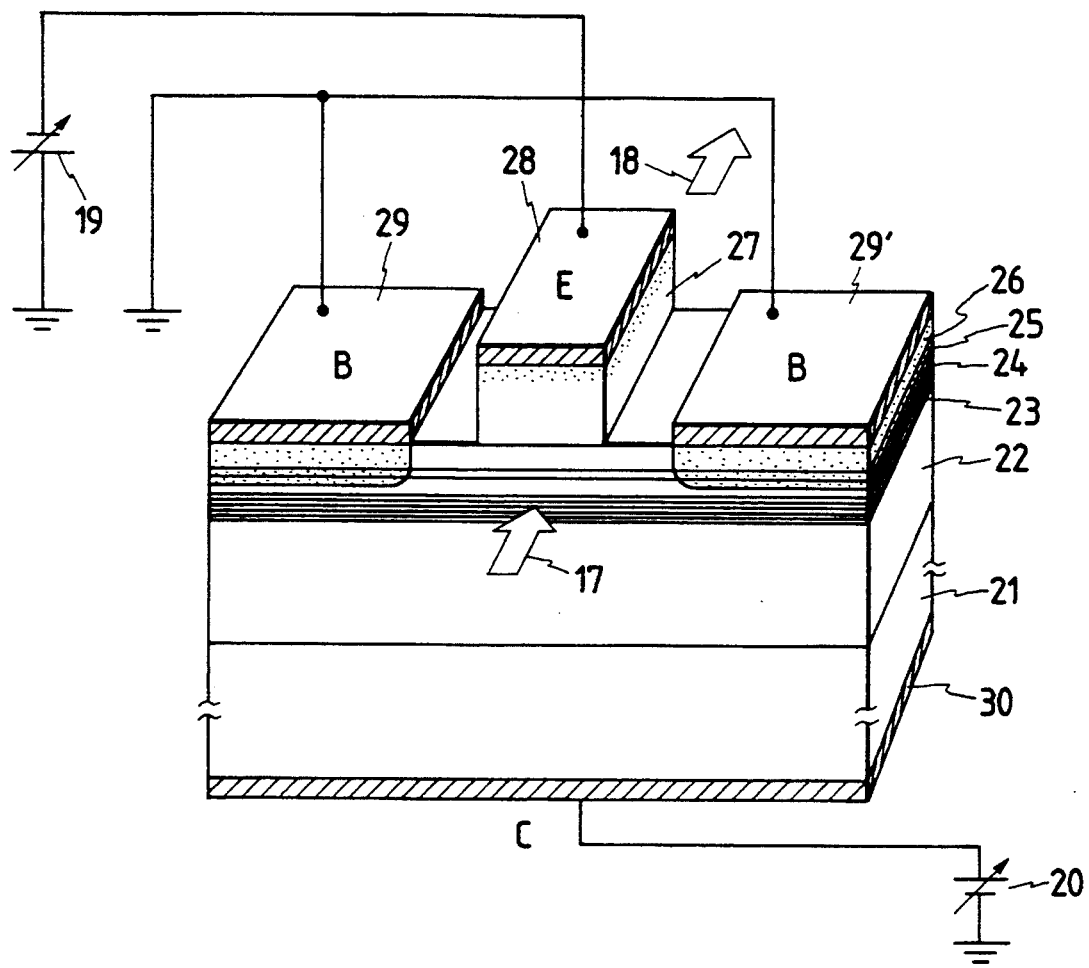
FIGS. 3A and 3B are a schematic perspective view showing an optical semiconductor device in a first example of the present invention, and its energy band diagram, respectively.
Figure 3B:
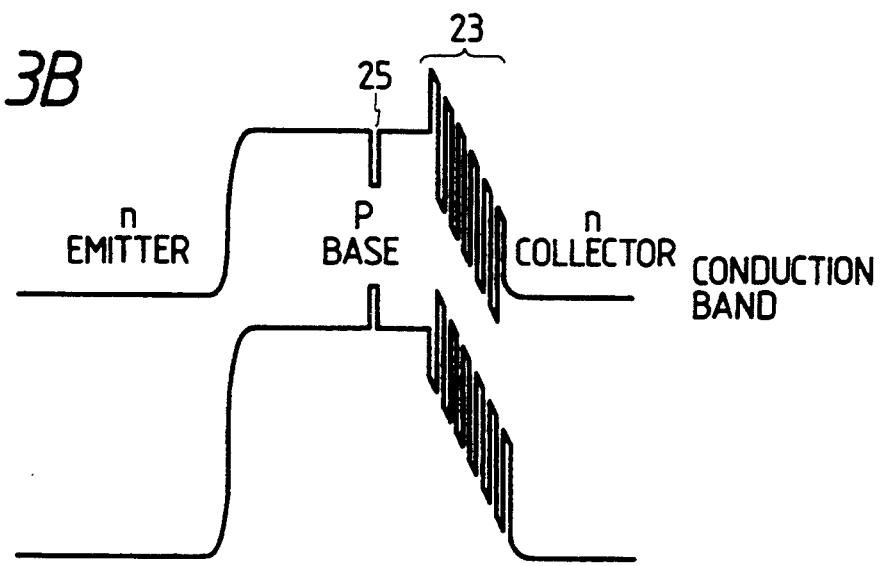

FIG. 3A is a schematic perspective view showing an optical semiconductor device in a first example according to the present invention. The device of this example is used as a light amplifier or filter for selectively amplifying and emitting the light of desired wavelength among the incident light upon the device. FIG. 3B is an energy band diagram in the neighborhood of an active area of the device as shown in FIG. 3A.

In FIG. 3A, reference numeral 21 is an n-GaAs substrate, reference numeral 22 is a clad layer having a thickness of 1.5 $\mu$m, and reference numeral 23 is a multiple quantum well (MQW) layer. The MQW layer 23 is formed by alternately laminating five well layers consisting of non-doped intrinsic (i-) $Al_{0.04}Ga_{0.96}As$ and each having a thickness of 100 Å, and five barrier layers consisting of i-$Al_{0.5}Ga_{0.5}As$ and each having a thickness of 100 Å. Reference numeral 24 is a p-$Al_{0.25}Ga_{0.75}As$ layer and having a thickness of 100 Å. The active layer 25 has a single quantum well structure. Reference numeral 26 is a p-$Al_{0.25}Ga_{0.75}As$ layer having a thickness of 0.1 $\mu$m. Here, the layers 23, 24, 25 and 26 constitute an optical waveguide.

Furthermore, reference numeral 27 is an n-$Al_{0.5}Ga_{0.5}As$ clad layer processed as the ridge shape having a width, or length in a left to right direction of FIG. 3A, of 3 $\mu$m, reference numeral 28 is an Au/AuGe electrode for conduction to the clad layer 27, reference numerals 29, 29' are Au/Cr electrode provided on the layer 26, and reference numeral 30 is an Au/AuGe electrode formed on a bottom surface of the n-GaAs substrate 21.

The device as fabricated in the above way is annealed in a thermostatic oven. With this annealing, the metal forming each electrode is diffused in a semiconductor layer, and electrode diffusion areas as indicated by dots are formed. Each electrode is placed into ohmic contact with each area of emitter, base and collector of the device by such electrode diffusion area.

The device of this example is a hereto bipolar transistor in which the electrode 28 corresponds to an emitter electrode, the electrodes 29, 29' correspond to base electrodes, and the electrode 30 corresponds to a collector electrode.

Between the emitter electrode 28 and the base electrodes 29, 29', an electric field of forward bias is applied by a variable voltage source 19. Also, between the base electrodes 29, 29' and the collector electrode 30, an electric field of reverse bias is applied by a variable voltage source 20.

The length of the ridge is formed in 200 $\mu$m. Also, both ends of device are made of mirror surfaces parallel to each other by the cleavage, and the optical waveguide consisting of layers 23 to 26 constitutes a Fabry-Perot resonator. Light of a selected wavelength among the incident light 17 upon one end face of the device is resonated within the above resonator, and amplified to exit as the light 18 from the other end face of the device. The wavelength of amplified light can be changed by changing the strength of the electric field applied between base and collector.

The energy band diagram in the neighborhood of the active layer in a state where the device of this example is not energized is shown in FIG. 3B. Here, if an electric field of forward bias is applied between the emitter electrode 28 and the base electrodes 29, 29', electrons will flow to the base side containing the active layer 25, and by recombination with holes in the active layer 25 having a lower energy, the light is amplified.

On the other hand, if an electric field of reverse bias is applied between the base electrodes 29, 29' and the collector electrode 30, the electric field applied to a non-doped MQW layer 23 is increased (because of an intrinsic layer only in this area), the refractive index thereof is changed with the QCSE.

In this example, with a setting where the light having a wavelength of more or less than 830 nm is entered, the energy gap in a non-energized state of the active layer 25 is made a composition corresponding to a light having a wavelength of 815 nm, so as to have the greatest gain at that composition. The reason to do so is that if carriers are injected, the band gap is narrowed due to the many-body effect between carriers, with the maximum gain being at a position shifted 100 to 150 Å from the non-energized state toward a longer wavelength side, so that it is made correspondent with the wavelength of incident light at the shifted position.

Also, the MQW layer 23 is designed to have an exciton wavelength of 820 nm. This is because in order to have the greatest variation of refractive index for the incident light having a wavelength of 830 nm, it is sufficient that this wavelength may be shifted about 100 Å toward the longer wavelength side from the exciton wavelength (820 nm in this example). The fact that the wavelength at which the variation of refractive index due to QCSE is greatest is a wavelength about 100 Å longer than the exciton wavelength has been described in "Quadratic electro-optic effect due to the quantum-confined Stark effect in quantum walls" by Joseph S. Weiner, Appl. Phys. Lett., Vol. 50, pp 842–844 (1987).

Figure 4A:
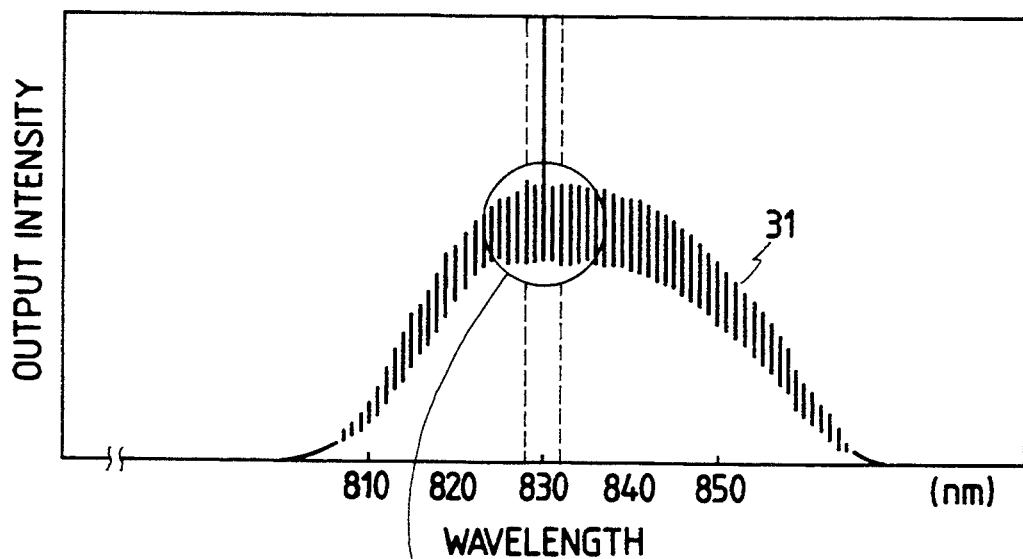
FIGS. 4A and 4B are a diagram showing the emitted light spectra in the first example, and its partially enlarged diagram, respectively.
Figure 4B:
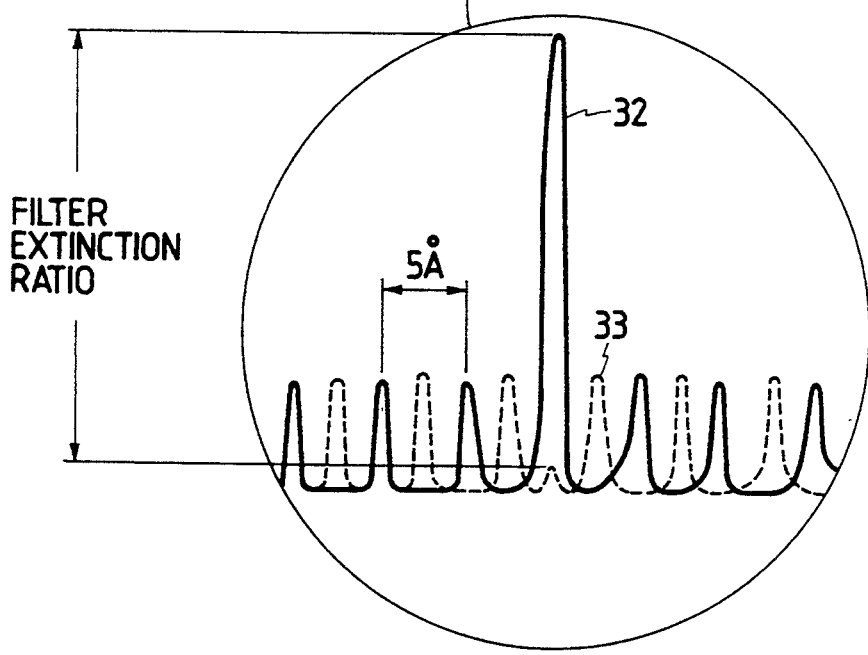

FIG. 4A is a diagram showing the emergent light spectra when the light having a wavelength of 830 nm is guided in an optical semiconductor device of this example, and FIG. 4B is a partially enlarged diagram.

In FIG. 4A, reference numeral 31 shows the spectra in a state where the spontaneous emission light emitted by the active layer 25 and the light entered from the outside and amplified are mixed. Then, the ripple with the Fabry-Perot resonation appears at every wavelength of 5 Å in the neighborhood of 830 nm. As shown in the spectra of FIG. 4B which illustrates only the neighborhood of 830 nm on a larger scale, if 830 nm just coincides with the wavelength of the ripple, the light is amplified as indicated by the solid line, and if not, the amplification is decreased as indicated by the broken line 33.

In this case, as previously described, the refractive index is changed by applying the reverse bias between the base electrodes 29, 29' and the collector electrode 30, thereby causing the propagation constant to be changed, so that the wavelength of the ripple can be shifted toward the longer wavelength side. If the width of this shift lies within 5 Å, the wavelength of the light to be selectively amplified can be continuously changed.

In FIG. 3A, an electric field due to the built-in potential with the pn junction is applied to the MQW layer 23 even during the non-energized period, so that the potential is inclined as shown in FIG. 3B. Accordingly, it is possible to make a shift of 5 Å in the wavelength to be amplified by changing the state from slightly forward bias to reverse bias in a range from +0.2 V to −0.8 V.

Then, if the electric field causing the reverse bias is increased, the absorption is also increased due to QCSE, so that the intensity of emergent light is decreased. To compensate for this, the output is made constant by increasing the emitter-base current flow and thus the gain, so that the variable wavelength filter having a stable output can be implemented.

This example uses a pnp-type hetero bipolar transistor structure, but the same feature can be also obtained with an npn-type hetero bipolar transistor structure in which n and p are reversed.

While in the first example, the amplification of light was made with the Fabry-Perot type resonation, the resonation due to the distributed reflection with the grating can be also used.

Figure 5A:
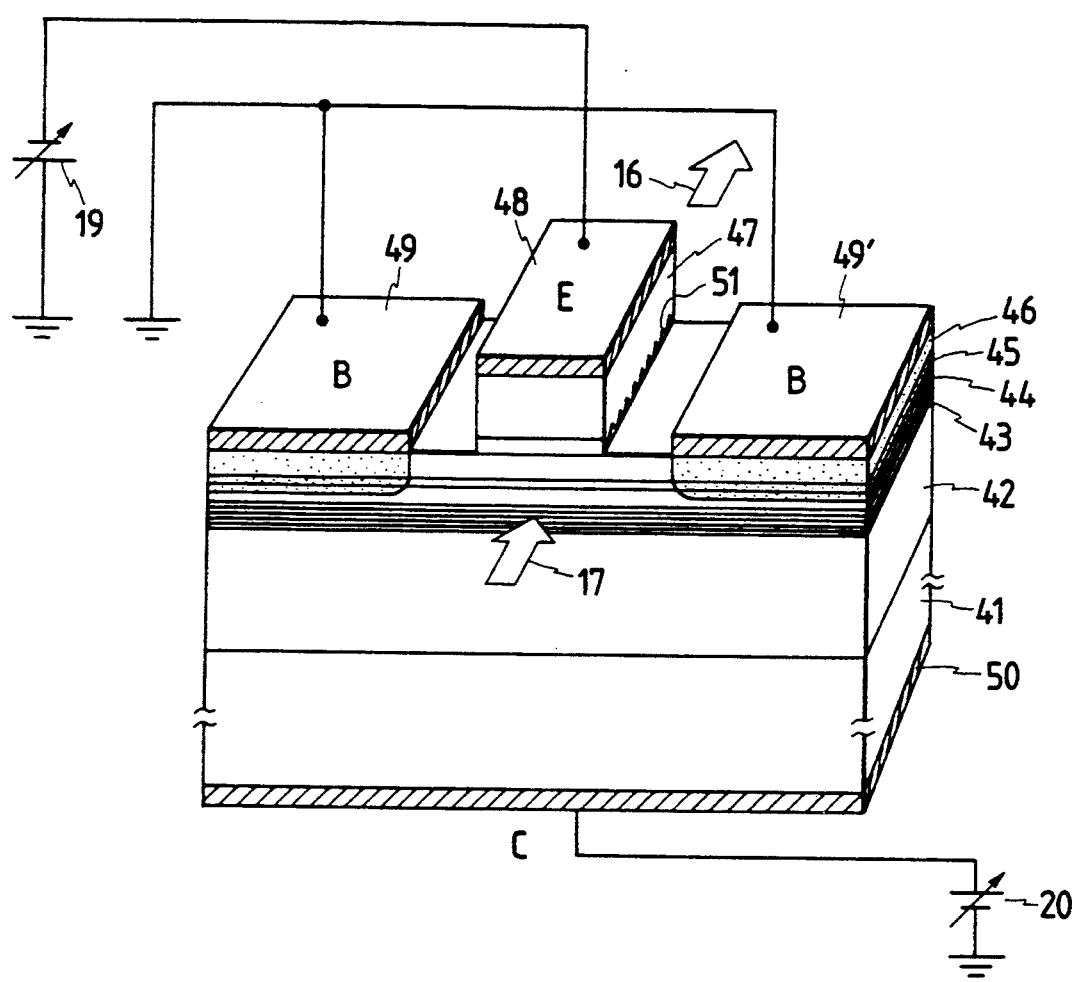
FIGS. 5A and 5B are a schematic perspective view showing an optical semiconductor device in a second example of the present invention, and its energy band diagram, respectively.
Figure 5B:
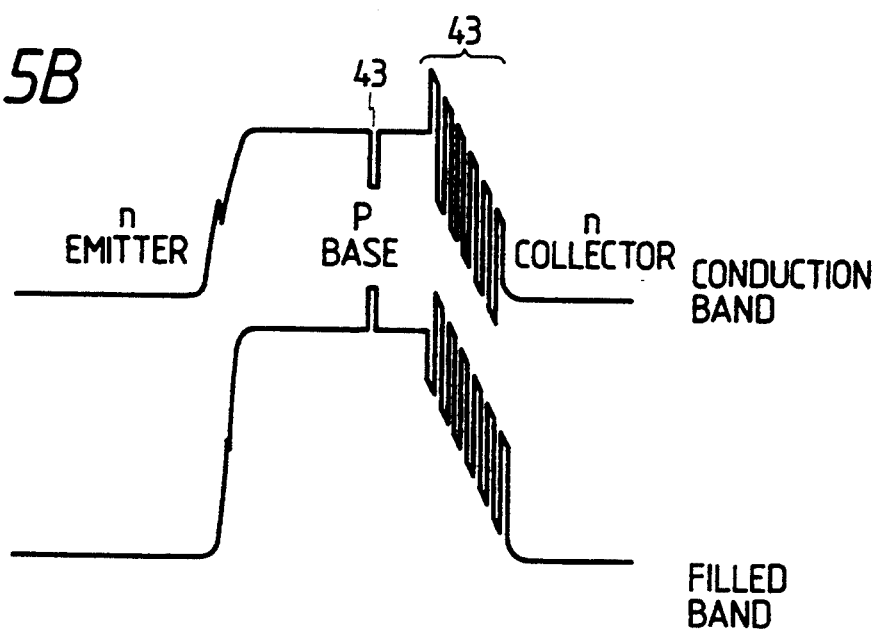

FIG. 5A is a schematic perspective view showing an optical semiconductor device in a second example according to the present invention, by the use of such a grating. The device of this example is used as a light amplifier or filter for selectively amplifying and emitting the light of a desired wavelength among the incident light upon the device. FIG. 5B is an energy band diagram in the neighborhood of an active layer of the device as shown in FIG. 5A. In FIG. 5A, the same reference numerals are attached to the members as in FIG. 3A, and the detailed explanation will be omitted.

In FIG. 5A, members designated by reference numerals 41 to 50 correspond to members designated by reference numerals 21 to 30 in the first example, respectively, and are formed to the same materials and in the same thicknesses. A different point is that an n-$Al_{0.25}Ga_{0.75}As$ layer 51 formed with a grating is provided 0.2 $\mu$m in thickness between a p-$Al_{0.25}Ga_{0.75}As$ layer 46 and an n-$Al_{0.5}GA_{0.5}As$ layer. Assuming the pitch of this grating to be $\Lambda$, the Bragg wavelength at which the light is reflected in distribution by this grating is $\lambda_B = 2N\Lambda$, where N can be determined by the equivalent refractive index of the waveguide, and only the light having that wavelength is amplified.

In the device of this example, the light 17 incident upon one end face of the device is guided through an optical waveguide consisting of layers 43 to 46. Among the waveguide light, the light having the wavelength satisfying the Bragg condition for the grating 51 causes a laser resonation due to the distributed feedback, thereby being amplified, and is emitted as the light 18 from the other end face of device. The wavelength of the amplified light is changed by changing the strength of the electric field applied between base and collector.

In the device of this example, like the distributed feedback (DFB) type laser, with the provision of a portion for shifting the phase of light by $\pi/2$ by reversing the corrugation (convex and concave) in a portion of the grating, it is possible to selectively amplify the light by one wavelength stably.

FIG. 6 is a diagram showing the wavelength spectra of emergent light in the device of this example. In FIG. 6, reference numeral 55 shows the wavelength spectra of the emergent light, reference numeral 52 shows a portion of the Bragg wavelength on a large scale, reference numeral 53 shows the ripple with the reflection at an end face of the device, and reference number 54 as indicated by the broken line shows an emergent spectrum when a voltage of −0.8 V is applied between the base and collector. In the second example, the pitch $\Lambda$ of grating is set to be 0.121 $\mu$m, and the Bragg wavelength $\lambda_B$ to be 830 nm. Here, like in the first example, if a voltage of +0.2 V to −0.8 V is applied between the base electrodes 49, 49' and the collector electrode 50, the equivalent refractive index is varied about $2 \times 10^{-3}$, and the resonant wavelength with the Bragg reflection is shifted by 15 Å to the longer wavelength side from the solid line 52 to the broken line 54. In this case, like in the first example, by controlling the current between the emitter electrode 48 and the base electrodes 49, 49' so as to compensate for the decrease of output due to absorption, the output is made stable, so that the variable wavelength filter having a shift width of 15 Å can be implemented.

While in the first example, there are some cases that the beat noise may occur because the ripple due to the Fabry-Perot resonation may interfere with the amplified light, it is noted that in this example, the amplitude amplified at the Bragg wavelength due to diffraction at the grating becomes very large, and other ripple light amplitude becomes small, so that the beat noise can be made small.

In the above first and second examples, the present invention was applied to the light amplifier for amplifying the light of selected wavelength, but the constitution of the present invention can be also applied to a laser.

Figure 7A:
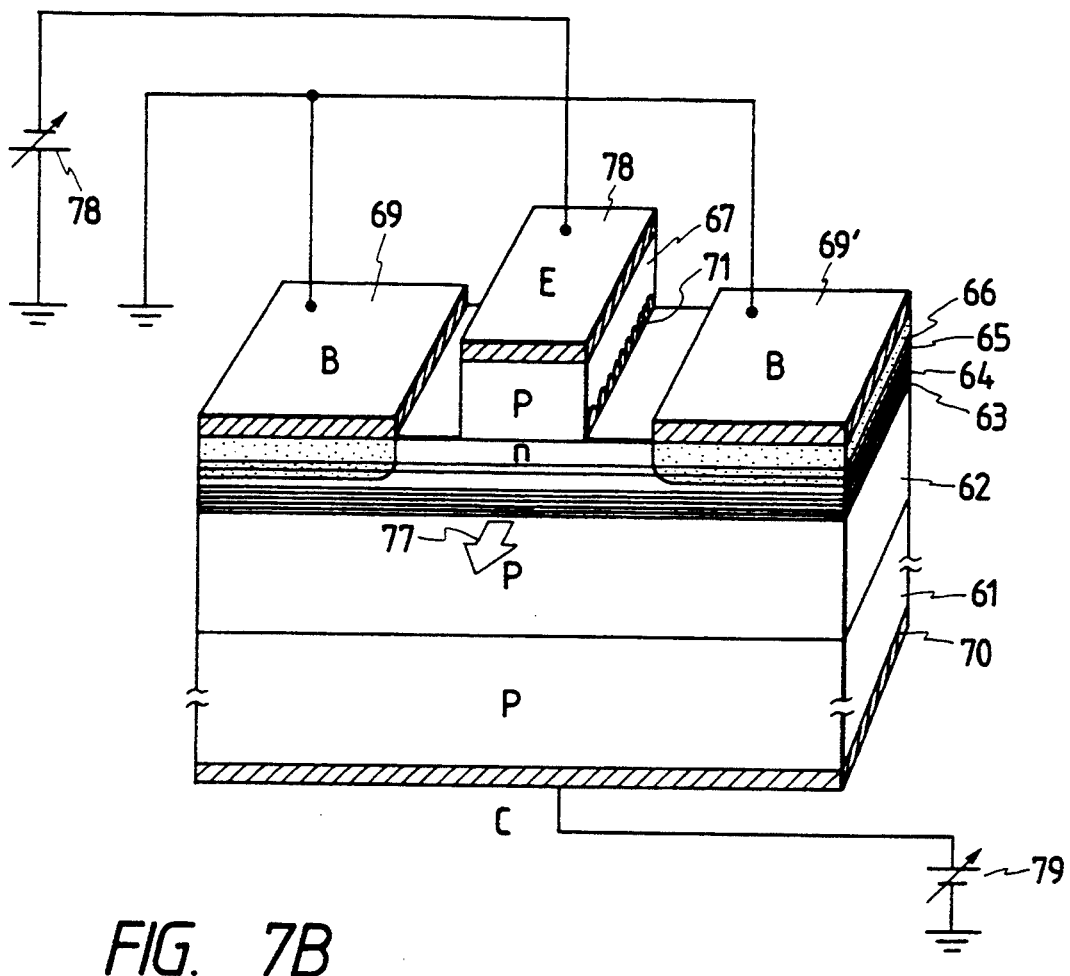
FIGS. 7A and 7B are a schematic perspective view showing an optical semiconductor device in a third example of the present invention, and its energy band diagram, respectively.
Figure 7B:
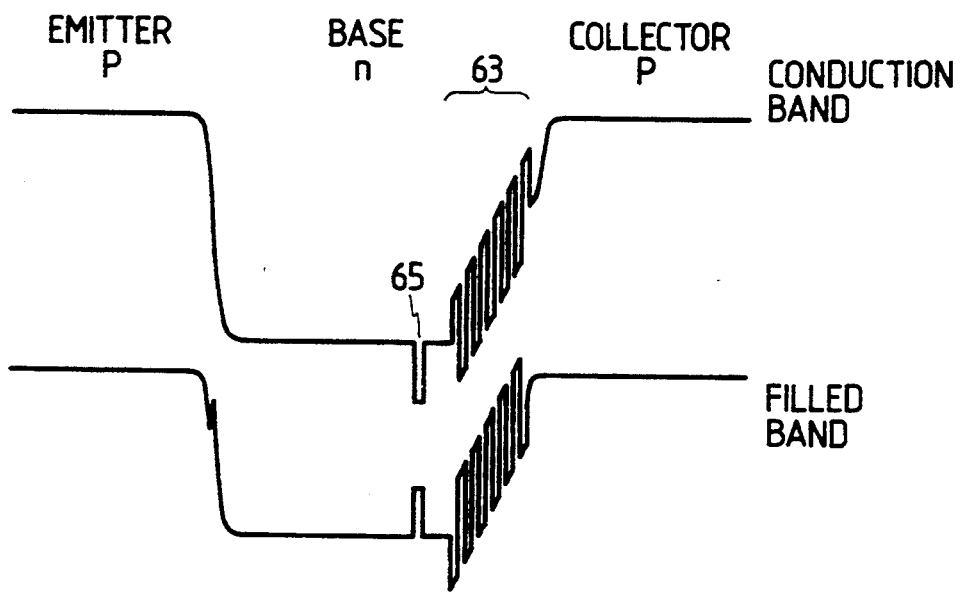

FIG. 7A is schematic perspective view showing an optical semiconductor device in a third example according to the present invention. The device of this example is used as a laser light source for amplifying and emitting selectively the laser beam of a desired wavelength. FIG. 7B is an energy band diagram in the neighborhood of an active layer of the device as shown in FIG. 7A.

In FIG. 7A, members designated by reference numerals 61 to 64, and reference numerals 66 to 71 correspond to members designated by reference numerals 41 to 44, and reference numerals 46 to 51 in FIG. 5A, respectively, and are formed of the same material and in the same thickness and dimensions. A different point is that the n-type and the p-type is reversed as compared with the above example, such that the base areas 64, 65, 66 are of the n-type, the emitter areas 67, 71 and the collector areas 61, 62 are of the p-type. This is due to the fact that the pnp type may more effectively allow the carriers passing to the base to be recombined in the active layer 65, in which the potential barrier for the electrons is higher than that the holes, and if considering the amount of carriers passing from the emitter to the base and leaking to the collector side, the holes have a higher rate of prevention with the same potential barrier.

Also, the active layer 65 is fabricated as an n-$Al_{0.05}Ga_{0.95}As$, having a mixed crystal ratio of Al slightly higher than that of the active layer 45 of FIG.

5A, thereby to a slightly widen the energy gap and shift the peak gain to the shorter wavelength side, Between the emitter electrode 68 and the base electrodes 69, 69', an electric field of forward bias is applied with a variable voltage source 78. Also, between the base electrodes 69, 69' and the collector electrode 70, an electric field of reverse bias is applied with a variable voltage source 79.

In the device of this example, if a current greater than a threshold is supplied to the active layer 65 with the voltage source 78 as previously described, the active layer 65 will emit the light. The light emitted from the active layer 65 is guided through the optical waveguide composed of layers 63 to 66. Among that waveguide light, the light having a wavelength $\lambda_B$ satisfying the Bragg condition determined by a pitch $\Lambda$ of the grating 71 causes the laser resonation due to distributed-feedback, and is emitted as a laser beam 77 from an end face of the device. At this time, the reverse bias is applied between base and collector as in the second example, the propagation constant of light changed, so that the Bragg wavelength is changed, and the laser oscillation wavelength is shifted. In this way, this example has the same operational principle as the second example, but is different in that the laser oscillation is caused with the current passed through the active layer 65 being above a threshold.

To be noted here is that the absorption in the MQW layer 63 is increased with the QSCE effect due to the application of an electric field, and some measures must be taken so as not to cause the threshold current to change greatly. For this purpose, in the third example, the peak wavelength of gain in the active layer 65 is designed to be shorter by 2 to 3 nm than the Bragg reflection wavelength with the grating when there is no electric field.

Figure 8:
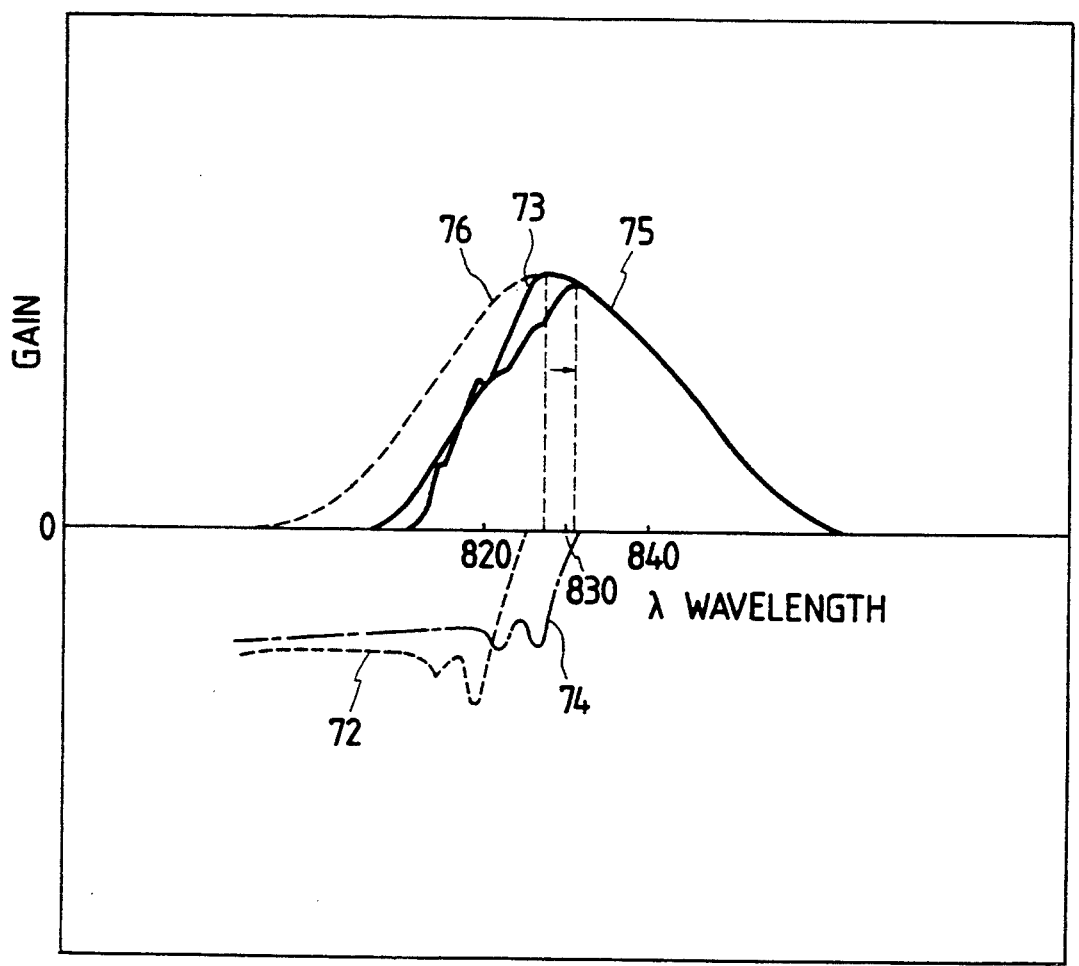
FIG. 8 is a diagram showing the gain spectra in a third example.

That is, as shown in FIG. 8, due to both effects of the gain spectrum 76 of the active layer 65 and the absorption spectrum 72 of the MQW layer 63, the gain spectrum as a whole of waveguide is as shown by the curve 73 when there is no electric field. When an electric field of about $1 \times 10^5$ v/cm is applied between base and collector, the energy gap of the MQW layer 63 will be reduced due to the QCSE effect, and the absorption peak with the exciton will shift to the longer wavelength side, as indicated by the dot-and-dash line. Thus, the overall gain spectrum is changed, and the peak gain shifts to the longer wavelength side, as indicated by the curve 75. Therefore, if the Bragg wavelength $\lambda_B$ is made 830 nm which is longer than a gain peak wavelength of 827 nm when there is no electric field, it becomes $\lambda_B=831.5$ nm when the electric field is applied, which is substantially the same as the gain peak shifted as indicated by the curve 75, so that the gain is not greatly changed. On the contrary, at a gain peak of 827 nm when there is no electric field, the gain may greatly decrease when the electric field is applied, whereby if the Bragg wavelength is set at that value, the oscillated wavelength cannot be changed with stable output. Thus, with the above constitution, the variable wavelength laser having the stable output and a wide range of variable wavelength can be realized.

Figure 9:
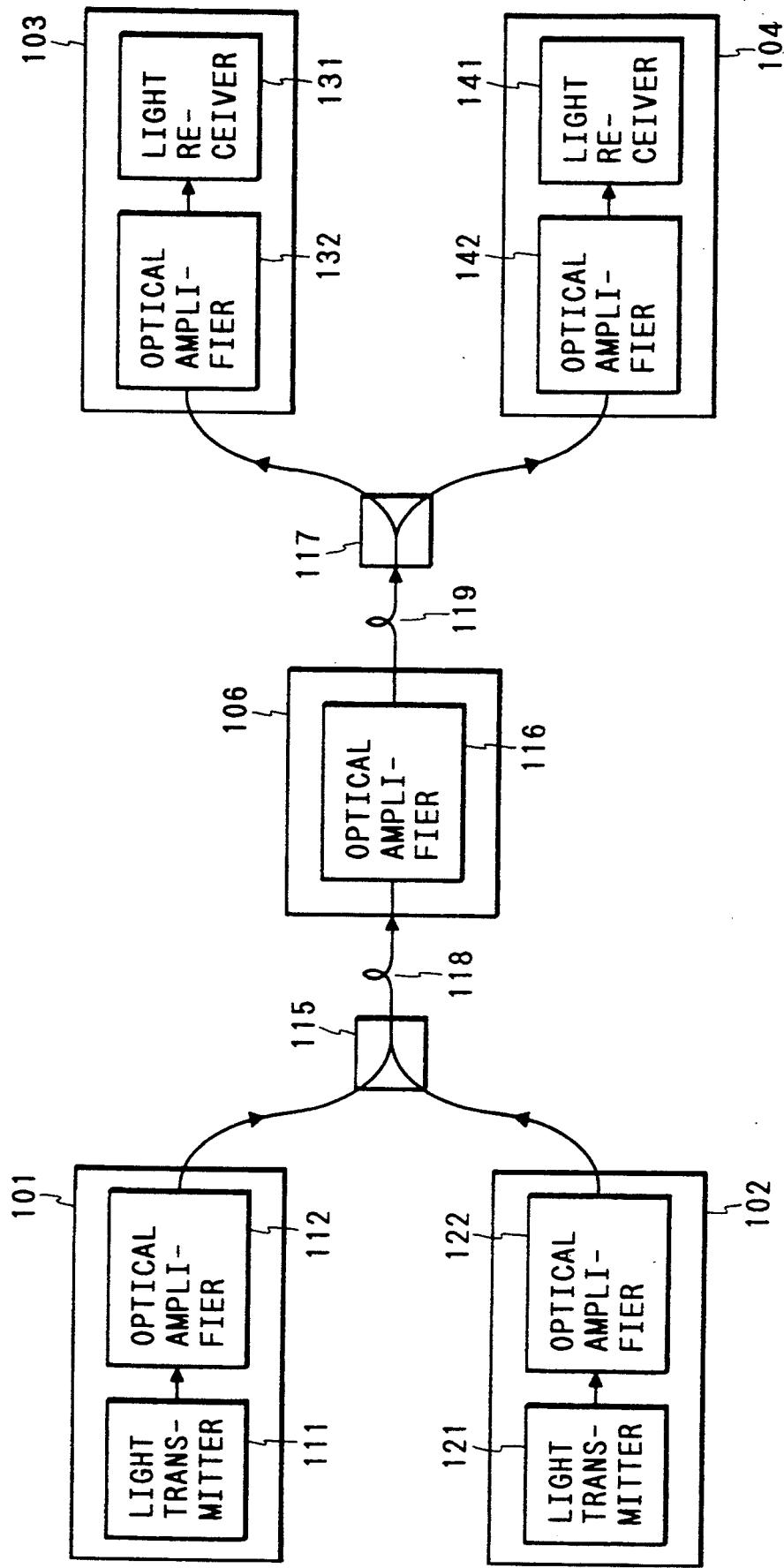
FIG. 9 is a block diagram illustrating one example of an optical communication system using a light amplifier of the present invention.

Next, FIG. 9 shows an optical communication system in which the above semiconductor device is used as an optical amplifying apparatus. In FIG. 9, the reference numerals 101 and 102 are transmitters, reference numerals 115 and 117 are branch-combine devices, reference numeral 106 is a repeater, reference numerals 103 and 104 are receivers, and reference numerals 118 and 119 are optical transmission lines. The transmitters 101 and 102 respectively include light transmitters 111 and 121 which are provided with a signal processing portion or processor and an electro-optical converting portion or transducer, and optical amplifying devices 112 and 122 for amplifying light signal output from the light transmitters 111 and 121. The receivers 103 and 104 respectively comprise optical amplifying devices 132 and 142 for amplifying an input signal and light receivers 131 and 141 which involve an opto-electric transducer and a signal processing portion.

In the optical communication system of FIG. 9, light signals output from the light transmitters 111 and 121 are amplified by the amplifying devices 112 and 122 and are output from the transmitters 101 and 102. The output signals are so controlled that they do not collide with each other on the transmission line 118, using a prescribed multiplexing system, such as time division multiplexing, frequency division multiplexing, CSMA/CD (carrier sense multiple access/collision detection), etc., and they are sent to the transmission line 118 through the branch-combine device 115. When the light signal is transmitted in the transmission line 118, the light is attenuated, so that the light signal is amplified by the repeater equipment 106. In the FIG. 11, only one repeater equipment 106 is disposed, but if necessary, the repeater equipment 106 may be disposed at plural locations. Or, no repeater equipment can be used, if unnecessary.

The light signal amplified by the repeater equipment 106 is input into the branching-combining device 117 through the light transmission line 119 and is separated by such a separation method as corresponds to the multiplexing system to be input into the receivers 103 and 104. The light signal input to each of receivers 103 and 104 is amplified by the optical amplifiers 132 and 142 to compensate for losses generated in the light transmission line 119 and the branching-combining device 117 to be input into the light receivers 131 and 141. Thus, the communications from the transmitter 101 to the receiver 103 and from the transmitter 102 to the receiver 104 are conducted through the single light transmission lines 118 and 119.

In FIG. 9, there are two transmitters and two receivers, but the branch number of the branching-combining devices 115 and 117 may be increased to attain an N to N communication by using N number of transmitters and N number of receivers. Further, one to one communication is also possible without using the branching-combining devices 115 and 117. In FIG. 9, there is no need to dispose the optical amplifying apparatus in all illustrated locations. This apparatus has only to be disposed in such location where signal attenuation at each part should be compensated for.

Figure 10:
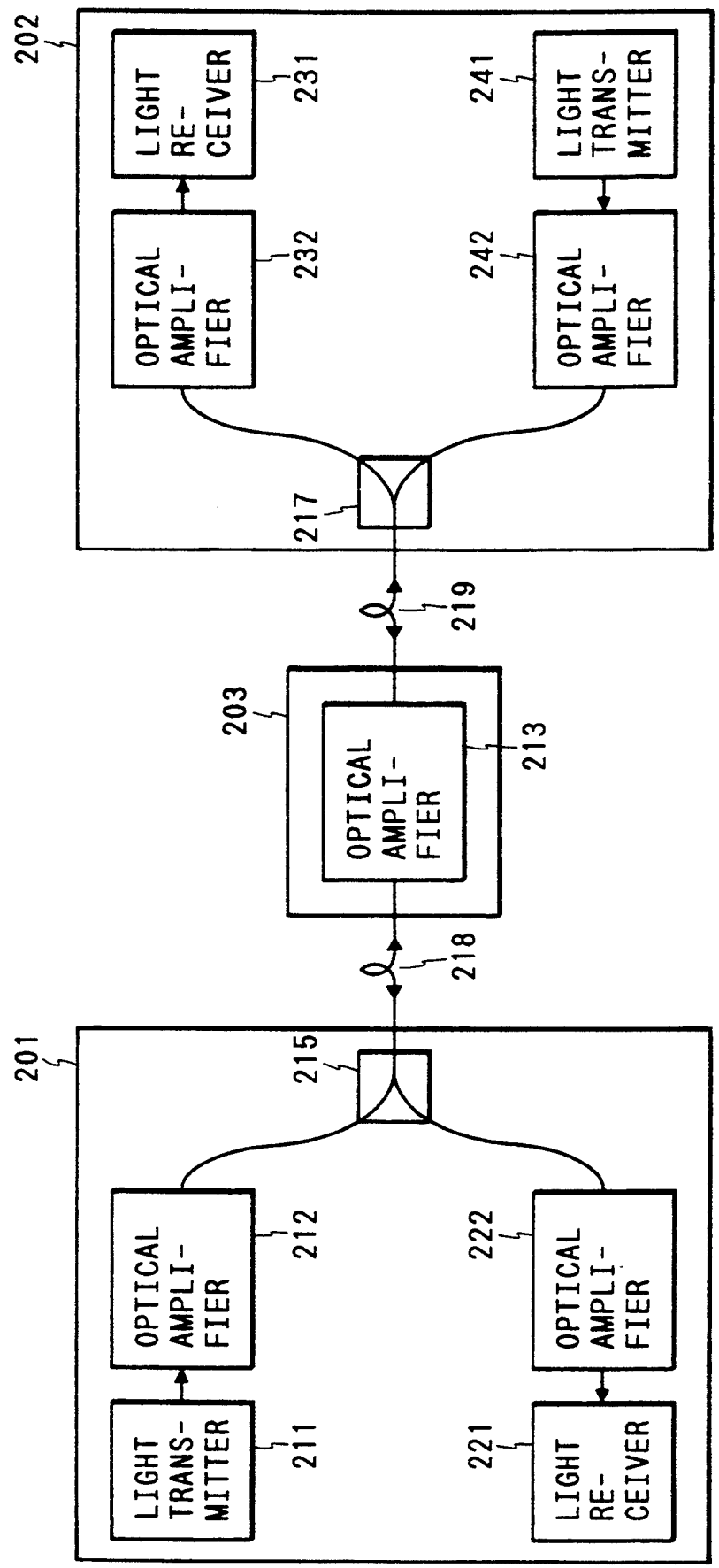
FIG. 10 is a block diagram showing one example of two-way optical communication system using a light amplifier of the present invention.

FIG. 10 shows the example of a bidirectional optical communication system in which the optical semiconductor device of this invention is employed as an amplifying apparatus. In the optical communication system shown in FIG. 10, the reference numerals 201 and 202 are transceivers, reference numeral 203 is a repeater, and reference numerals 218 and 219 are optical transmission lines. The transceivers 201 and 202 respectively include transmit parts and receive parts, and the transmit part consists of light transmitters 211 and 241 which involve a signal processor and an E/O converting portion, and optical amplifiers 212 and 242 for amplifying the signal output from the light transmitters 211 and 241. The receive part consists of optical amplifiers 222 and 232 for amplifying the input light signal and light receivers 221 and 231 which include an O/E converting portion and a signal processor. In the transceivers 201 and 202, the transmit and receive parts are connected by branch-combine devices 215 and 217. The repeater 203 includes an optical amplifier 213 and is connected to each transceiver 201 and 202 through the optical transmission lines 218 and 219.

In the structure of FIG. 10, light signals output from the light transmitter 211 in the transceiver 201 and the light transmitter 241 in the transceiver 202 are respectively amplified by the optical amplifiers 212 and 242 and are sent out from each transceiver 201 and 202 through the branch-combine devices 215 and 217. These output light signals are respectively transmitted in opposite directions through the optical transmission lines 218 and 219. The light signals are amplified by the repeater 203 since their light amounts are attenuated when the light signals are transmitted through the transmission lines 218 and 219.

In FIG. 10, the repeater 203 is disposed in one location, but if necessary, this can be placed in plural locations. If the repeater equipment is not needed, this may be omitted. The light signals amplified by the repeater 203 are further transmitted through the transmission lines 219 and 218 and input to the transceivers 202 and 201 at opposite sides. The input signals are branched off by the branch-combine devices 217 and 215 in the directions to the light receivers 231 and 221, are amplified by the optical amplifiers 232 and 222 in order to compensate for losses caused in the transmission lines 218 and 219 and the branch-combine devices 215 and 217 and are input into the light receivers 231 and 221. Thus, bidirectional communication is performed between the transceivers 201 and 202 through a single transmission lines 218 and 219.

In FIG. 10, there is illustrated an example of a bidirectional communication in which two transceivers are provided with each having one transmit part and one receive part. But, such structures are possible wherein each transceiver involves plural transmit parts and receive parts or wherein plural transceivers are connected by the branching-combining device. There is no need to dispose the optical amplifiers in all illustrated locations in FIG. 10, and the amplifier has only to be disposed where the attenuation of the light signal need be compensated for. For the rest, the system of FIG. 10 is the same with that of FIG. 9.

Figure 11:
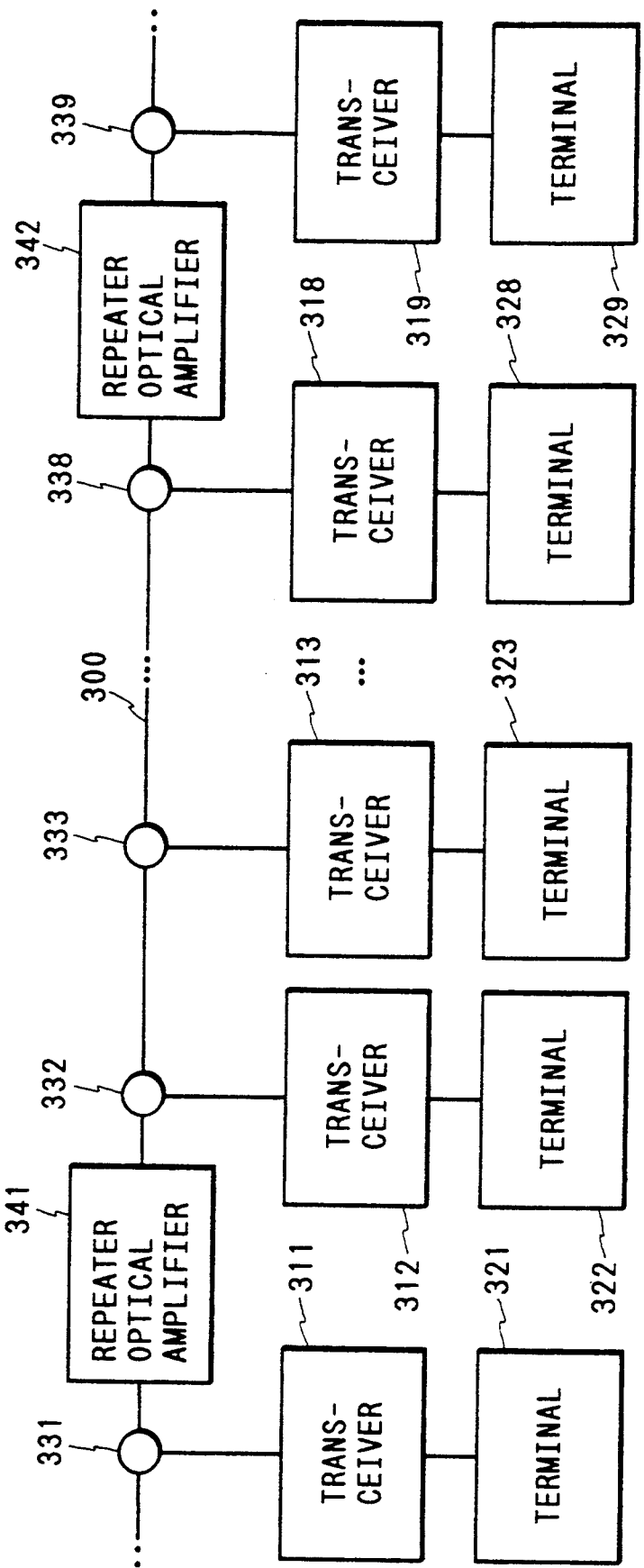
FIG. 11 is a block diagram showing one example of a bus-type optical communication network using a light amplifier of the present invention.
Figure 12:
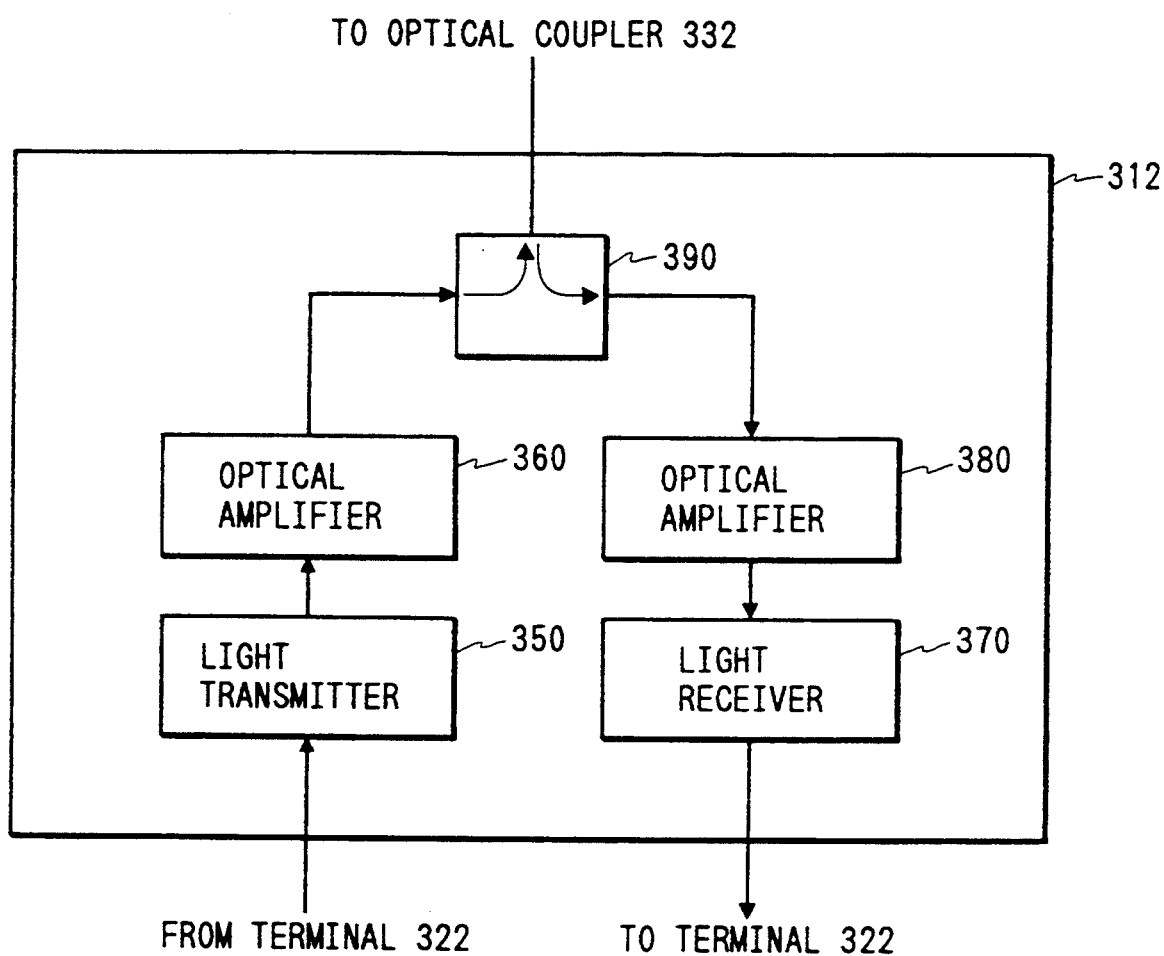
FIG. 12 is a block diagram showing a constitutional example of a transceiver in the network as shown in FIG. 11.

FIGS. 11 and 12 show a bus-type optical communication network in which the optical semiconductor device of this invention is used as an amplifying apparatus.

In FIG. 11 showing the overall system, the reference numeral 300 is an optical transmission line composed of, for example, optical fibers, reference numerals 311-319 are respectively transceivers which convert electric signals from terminals 321-329 to light signals to send them out to the transmission line 300, convert the light signal on the transmission line to the electric signal to transfer it to the terminal, and detect the condition of communication on the optical transmission line 300 to control the communication in such a manner that signals from other terminals will not collide with the signal from the own terminal. Further, the reference numerals 331-339 are respectively optical couplers which are connected to the transmission line 300, take out part of the signal on the optical transmission line 300 to transmit it to the transceivers 311-319 and send out to the transmission line 300 the light signals from the transceivers 311-319. The reference numerals 341-342 are respectively repeater optical amplifiers for amplifying the light signal on the transmission line 300 to transmit it, and the polarization insensitive optical amplifying apparatus is used as those repeater optical amplifiers 341-342.

FIG. 12 illustrates one example of the structure of the transceiver 312 in FIG. 11. In FIG. 12, the reference numeral 350 is a light transmitter which converts the signal from the terminal 322 to an optical signal and transmits this light signal to the transmission line by controlling in such a manner that the signals from the other terminals will not collide with that light signal on the optical transmission line 300. Reference numeral 360 is an optical amplifier for amplifying the light signal from the light transmitter 350, and reference numeral 370 is a light receiver which converts the light signal transmitted through transmission line 300 to an electric signal and transmits this electric signal to its own terminal if the signal is addressed to the own terminal (in this case terminal 322) which is connected to its own transceiver 312. Reference numeral 380 is an optical amplifier for amplifying the signal transmitted through the transmission line 300 to transmit it to the light receiver 370, reference numeral 390 is a branch-combine device for sending out the optical signal from the amplifier 360 to the coupler (in this case coupler 322) and transmitting the optical signal from the optical coupler 332 to the amplifier 380. The optical semiconductor device of this invention is utilized as the optical amplifiers 360 and 380. Here, only structure of the transceiver 312 is explained, but the other transceivers 311-319 also have similar structures.

The operation of this embodiment will be explained, assuming that the communication is performed between the terminals 322 and 329. Where the signal is to be transmitted from the terminal 322, first the light transmitter 350 does such control that the signal from the terminal 322 will not collide with the signals from the other terminals on the optical transmission line 300 preferably using a prescribed multiplexing system such as the time division multiplexing, frequency division multiplexing and CSMA/CD, and converts the signal from the terminal 322 to an optical signal to transmit it to the optical amplifier 360. This signal is amplified by the optical amplifier 360 to be sent out on the optical transmission line 300 in opposite directions by the optical coupler 332 through the branch-combine device 390. This optical signal reaches the repeater optical amplifier 342 through the couplers 333, ..., 338. At this time, part of the power of this optical signal power is branched by each optical coupler to be transmitted to the transceivers 313, ..., 318, and these transceivers recognize that this signal is not addressed to their own terminals 323, ..., 328 to abandon this optical signal. The optical signal arrived at the repeater optical amplifier 342 is lowered in this signal intensity since a part thereof is branched at each optical coupler, but its intensity is regained by the amplification at the repeat optical amplifier 342 and the thus regained signal is transmitted to the optical coupler 339 through the transmission line 300.

At the optical coupler 339, part of the optical signal is branched to be transmitted to the transceiver 319, and is sent to the light receiver through devices similar to the branch-combine device 390 shown in FIG. 12. In this light receiver, the transmitted optical signal is converted to an electric signal, and the light receiver recognizes that this signal is addressed to the terminal 329 and transmits it to the terminal 329.

Where the signal is transmitted from the terminal 329 to the terminal 322, the signal is transmitted on the transmission line 300 in the opposite direction based on a process similar to that mentioned above. Here, the optical signal reading the transceiver 312 passes through the optical couplers 338, . . . , 333, 332 and thereafter through the optical branch-combine device 390, so that the signal is attenuated at each part and its intensity is weakened. But, the signal is amplified by the optical amplifier 380 before reaching the light receiver 370, and is transmitted to the light receiver 370 after its intensity is regained.

Thus, the amplifier 360 amplifies the signal from the light transmitter 350 to transmit it to the transmission line 300, and the optical amplifiers 341, 342 and 380 compensate for the attenuation of light power caused in the path of light signal including the optical node to amplify the optical signal in such a manner that this has enough power to be received. Several advantages are achieved similar to those in the systems of FIGS. 9 and 10.

In this embodiment, the optical amplifiers are disposed right after the light transmitter 350, just before the light receiver 370 and on the optical transmission line 300, but, for example, if the light transmitter 350 can transmit the optical signal having sufficient power, the optical amplifier 360 is unnecessary. Further, if the output from the branch-combine device 390 has enough power to be received by the light receiver 370, the amplifier 380 is also dispensable. Further, if the number of optical couplers on the transmission line 300 is small, and the attenuation at the optical couplers is not critical, the optical amplifiers 341 and 342 on the transmission line 300 can also be omitted. Thus, all the amplifiers shown in FIGS. 11 and 12 are not necessary. When at least one of them is used, the bus-type optical communication network can get the above-mentioned advantages.

In the system of FIG. 11, the repeater optical amplifiers 341 and 342 are disposed on the optical transmission line 330 separately from the optical couplers 331, . . . , 339. But also where the repeater optical amplifier is contained in each optical coupler, the above-mentioned advantages can be attained only if the optical amplifying apparatus of this invention is used in the system.

In this embodiment, only a single transmission line 30 is used, but the above advantages can be attained also where the bidirectional communication or multiplexing communication is performed using, for example, plural optical fibers as optical transmission lines.

Figure 13:
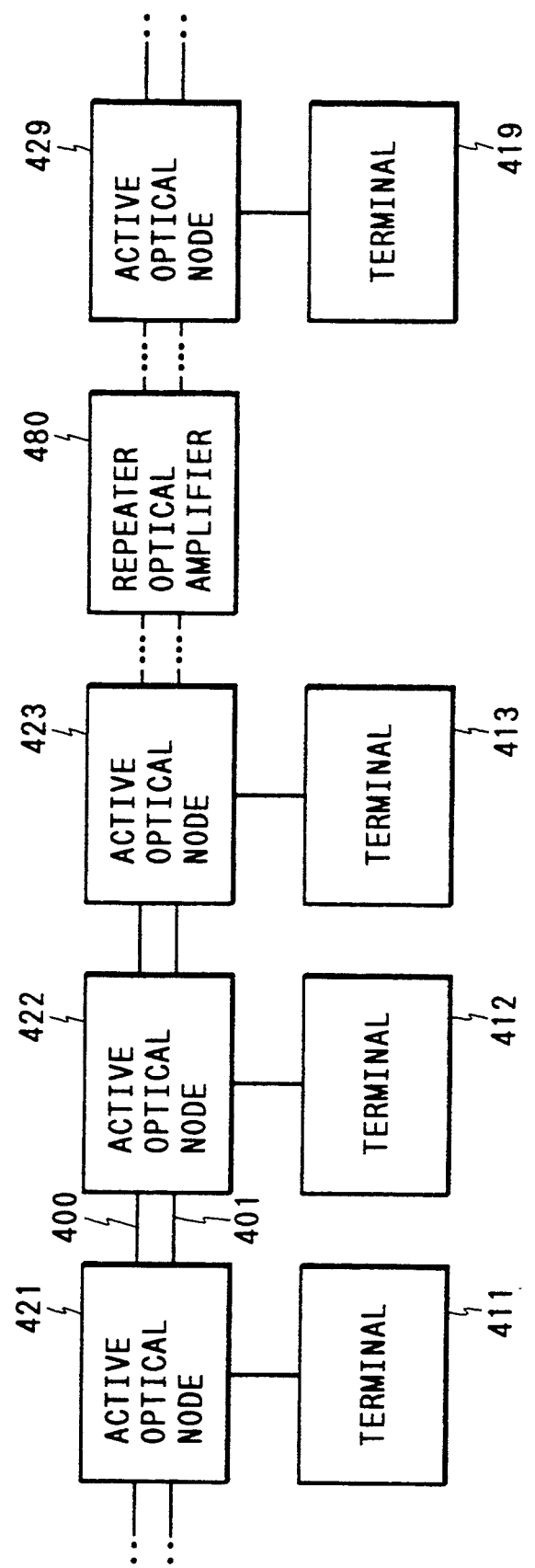
FIG. 13 is a block diagram showing one example of the bus-type optical communication network using the active optical node in which the light amplifier of the present invention is contained.
Figure 14:
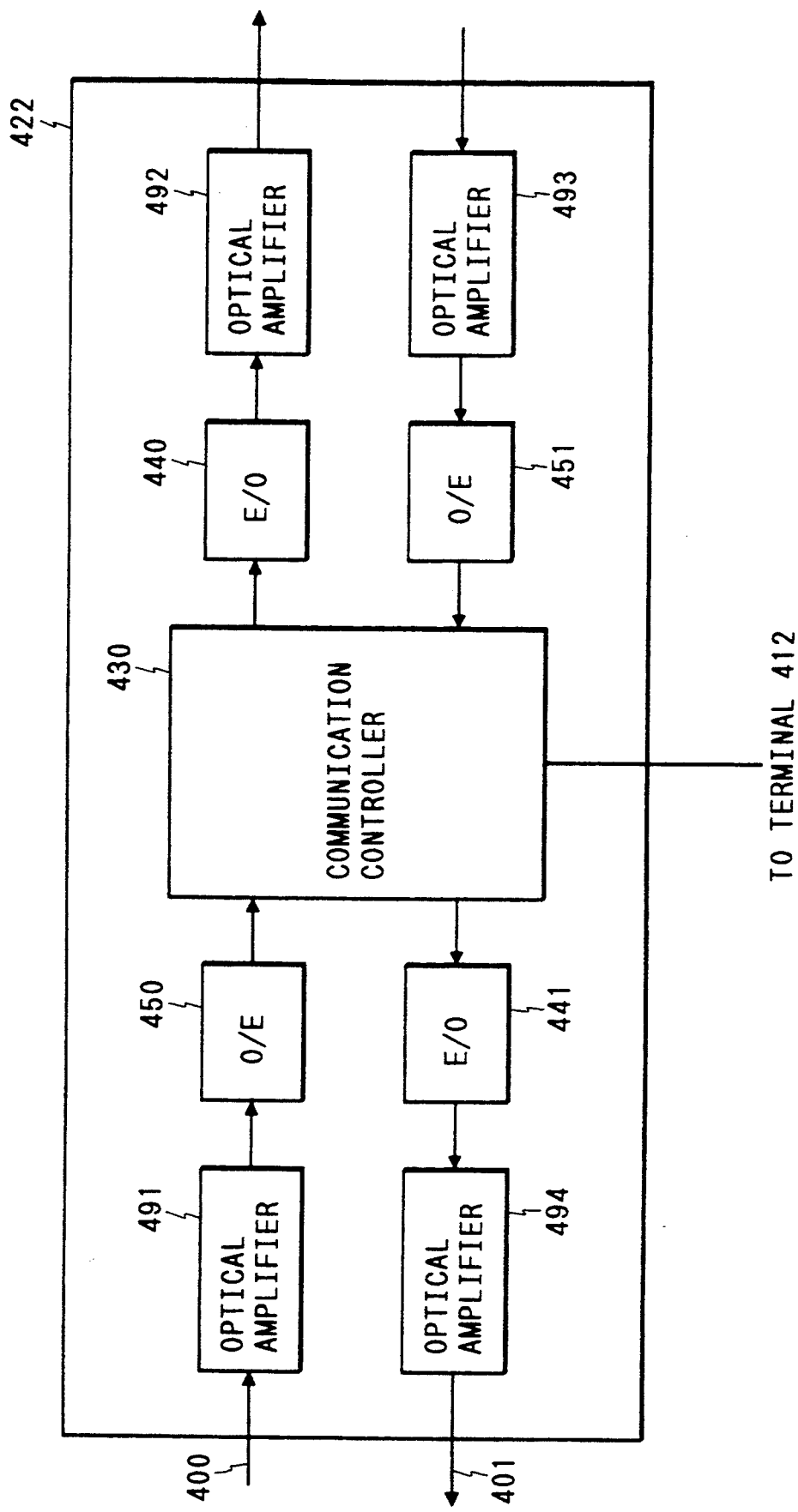
FIG. 14 is a block diagram showing a constitutional example of the active optical node as shown in FIG. 13.

FIGS. 13 and 14 show an example of an active bus-type optical communication network in which the optical semiconductor device is used as an amplifying apparatus. In FIG. 13 illustrating the overall structure of the system, the reference numerals 400 and 401 are optical transmission lines such as optical fibers, reference numerals 411, . . . , 419 are terminals for performing communication, reference numerals 421, . . . , 429 are active optical nodes for conducting light transmission, light receiving and communication control, and reference numeral 480 is a repeater optical amplifier for amplifying the optical signal. In FIG. 14 which shows, as an example, the structure of one of the active optical nodes 422, the reference numerals 450 and 451 are opto-electric converters (O/E) for converting the optical signal to an electric signal, reference numerals 440 and 441 are electro-optical converters (E/O) for converting the electric signal to the optical signal, and reference numerals 430 is a communication controller. The controller 430 discriminates if the signal transmitted through the transmission lines 400 and 401 and converted to the electric signal is addressed to the terminal 412, and if so, the controller 430 transmits the signal to the terminal 412 and if not so, the controller 430 again converts the signal to the optical signal using the E/O devices 440 and 441 to transmit this signal to the optical transmission lines 400 and 401. Further, when the signal is transmitted to the controller 430 from the terminal 412, the controller 430 converts the signal to the optical signal using the E/O devices 440 and 441 and transmits it to the transmission lines 400 and 401 under such control that the signal will not collide with the optical signals from the other terminals. The reference numerals 491–494 are optical amplifiers which comprise of optical semiconductor devices of this invention.

The operation of this embodiment will be explained, taking the case in which the signal is transmitted from the terminal 412 to the terminal 419, as an example. When the signal is output from the terminal 412, the communication controller 430 in the active optical node converts the signal from the terminal 412 to the optical signal by the E/O devices 440 and 441, amplifies this by the optical amplifiers 492 and 494 and transmits it on the optical transmission lines 400 and 401 in opposite directions, under such control that the signal from the terminal 412 will not collide with the signals from the other terminals on the transmission lines 400 and 401, using a prescribed multiplexing system such as time division multiplexing, frequency division multiplexing and CSMA/CD. This signal enters the active optical nodes 421 and 423, and is once converted to the electric signal to be input into the communication controller in the active optical nodes 421 and 423. However, this signal is not addressed to the terminal 411 and 413, the signal is once again converted to the optical signal to be sent out to the optical transmission line.

The distance between the terminals 423 and 429 is long, so that the optical signal loses its intensity in the optical fiber. To amplify this signal and compensate for the loss, the repeater optical amplifier 480 is amplified by the optical amplifier in the active optical node 429 and is then converted to the electric signal to reach the communication controller. The communication controller in the active optical node 429 recognizes that this signal is addressed to the terminal 419, and transmits it to the terminal 419. On the other hand, the signal sent out to the active optical node 421 from the node 422 through the transmission line 401 consecutively passes the active optical nodes and reaches the left end of the communication system. There, the signal is abandoned.

Thus, the optical transmission line 400 shares the signal transmission in the right direction in FIG. 13, and the line 401 shares that in the left direction. Therefore, signals output from any terminal are simultaneously transmitted in opposite directions, so they reach the addressed terminals without failure.

In the above manner, the optical amplifiers 492 and 491 amplify the signals from the E/O devices 440 and 441 to transmit them on the transmission lines 400 and 401, and the amplifiers 491 and 493 amplify the optical signals so that the attenuation of light power in the transmission line is compensated for and that they have enough power to be received. Further, the repeater amplifier 480 compensates for light losses where the distance between the active optical nodes is long. The optical semiconductor device of this invention is used as the above optical amplifiers.

In the system of this embodiment, the above-mentioned several advantages can be attained similarly to the systems of FIGS. 9 and 10.

In this embodiment, the optical amplifiers are disposed in several locations as shown in FIGS. 13 and 14, but, for example, if the E/O devices 440 and 441 can output the optical signal of enough power, there is no need to dispose the amplifiers 492 and 494. If the active node receives enough power so that the O/E devices 450 and 451 can receive it, the optical amplifiers 491 and 493 can be omitted. Further, if the distance between the terminals is not so long as to make losses in optical fibers considerable, the repeater optical amplifier 480 is dispensable. Thus, only if at least one amplifier is used, the active bus-type optical communication network can obtain the above-mentioned advantages.

In the system of FIG. 13, there are two transmission lines between the active optical nodes to perform the bidirectional communication. But also in cases where the bidirectional signal communication is performed in a single optical transmission line using the optical branch-combine device as shown in FIG. 10 and where the multiplexing signal communication is conducted using more than three or three transmission lines, the above advantages can be obtained if the optical semiconductor device of this invention is used in each optical transmission line.

Figure 15:
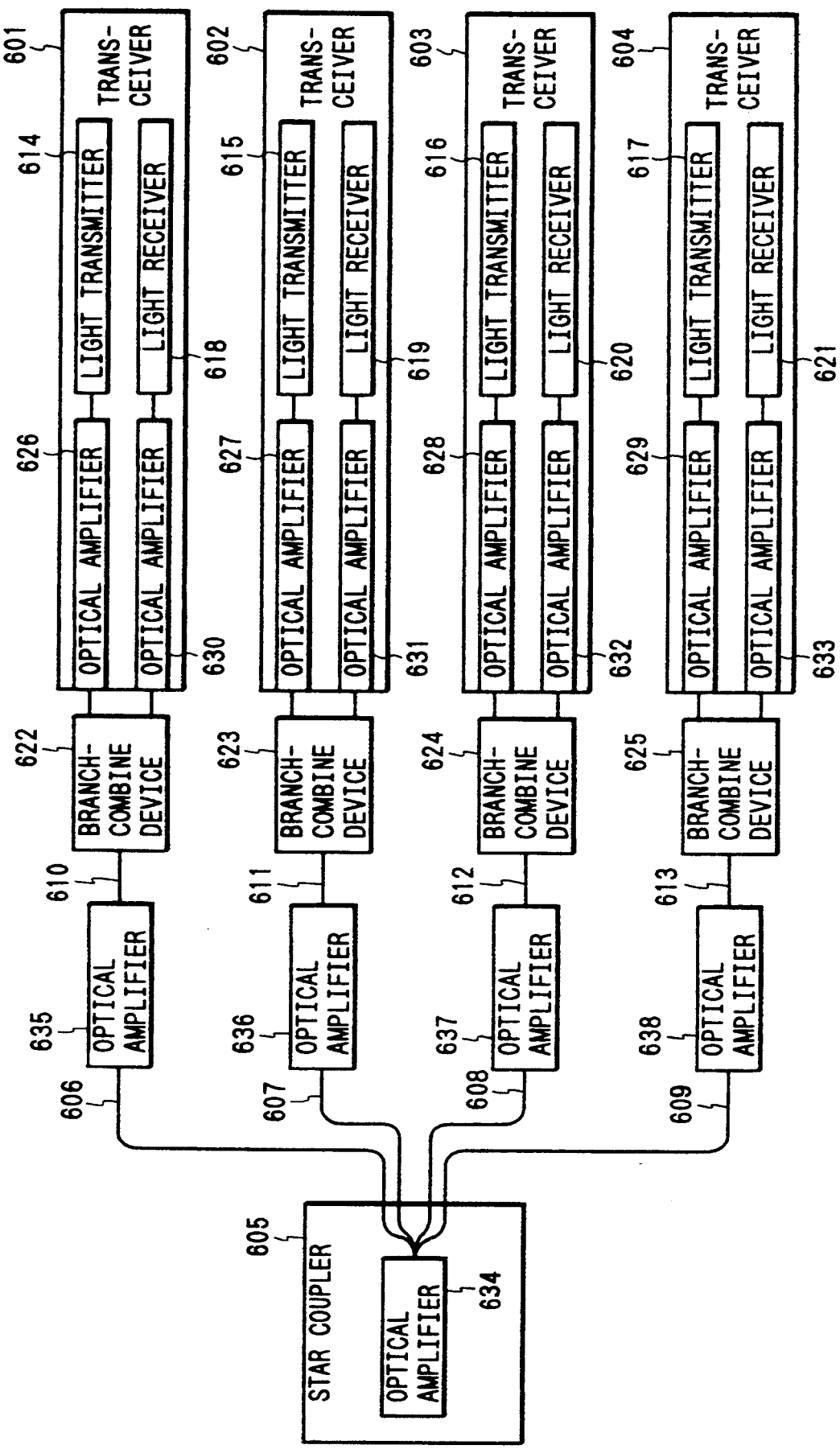
FIG. 15 is a block diagram showing one example of a star-type optical communication network using the light amplifier of the present invention.

FIG. 15 shows the structure of a star-type optical communication network in which the optical semiconductor device is used as amplifying apparatus. In this embodiment, there are four transceivers, and the optical signals are transmitted in each optical fiber in opposite directions.

In FIG. 15, the reference numerals 601–604 are transceivers which connect the terminals to the network, reference numeral 605 is a star coupler which connects inputs and outputs of the transceivers 601–604 in the network in a matrix form, reference numerals 606–613 are transmission lines which are optical fibers, reference numerals 614–617 are light transmitters which convert electric signals to optical signals to transmit them to the network, reference numerals 618–621 are light receivers which convert optical signals incident from the network to electric signals, reference numerals 622–625 are optical branch-combine devices which connect the transmitters 614–617 and receivers 618–621 in the transceivers to the optical fibers 610–613, and reference numerals 626–638 are the above optical amplifying apparatuses of this invention which directly amplify the optical signals. These amplifying apparatuses 626–638 are classified into booster amplifiers 626–629 of the light transmitters 614–617, pre-amplifiers 630–633 of the light receivers 618–621, a booster amplifier 634 of the star coupler 605 and repeater amplifiers 635–638 of the transmission line.

Next, the operation of this embodiment will be explained, assuming that the communication is performed from the end office 601 to the transceiver 603. The electric signal is converted into the optical signal in the transmitter 614 of the transceiver 601, and this light signal is amplified by the optical amplifier 626 and transmitted to the optical fiber 610 of the network through the branch-combine device 622. The optical signal incident on the optical fiber 610 is amplified by the optical amplifier 635 and is transmitted to the star coupler 605 through the optical fiber 606. The optical signal is amplified by the optical amplifier 634 in the star coupler 605, and is sent out to all the optical fibers 606–609 which are connected to the star coupler 605. The optical signals incident on the optical fibers 606–609 are amplified by the optical amplifiers 635–638, are branched by the branch-combine devices 622–625, and parts thereof are amplified by the optical amplifiers 630–633 to be transmitted to the receivers 618–621.

The receivers 618–621 convert the optical signals to electric signals. The transceivers 601–604 respectively discriminate the signal addressed to the own transceiver from those electric signals. This signal is addressed to the transceiver 603, so that the transceiver 603 identifies this signal and receives it. Thus, the communication is completed. Also in the star-type system, in order to transmit optical signals from any transceiver to all the transmission lines, the communication is conducted in such a manner that the optical signals will not collide with one another on the transmission line using the time division multiplexing, frequency division multiplexing, etc.

In this embodiment, the optical amplifying apparatuses which comprise the optical semiconductor devices of this invention are disposed in all paths along which the lights are transmitted in the network, but it is possible to dispose the optical amplifying apparatus in part of those paths. Further, in this embodiment, the transmitter and receiver are connected by the branch-combine device and the bidirectional communication is performed using one optical fiber for one transceiver. But, such system is possible in which two optical fibers for transmit and receive are used for one transceiver.

Figure 16:
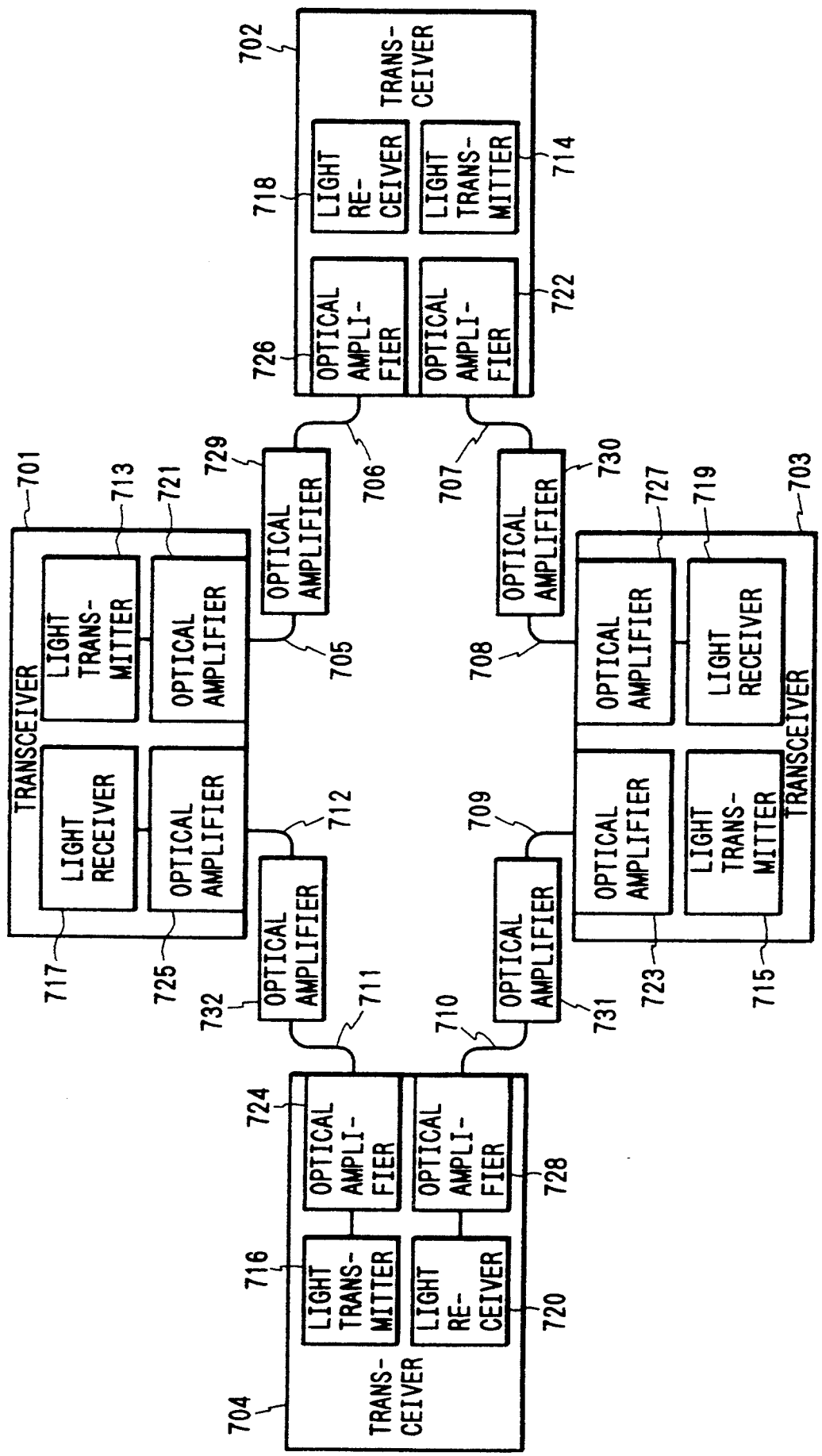
FIG. 16 is a block diagram showing one example of a loop-type optical communication network using the light amplifier of the present invention.

FIG. 16 shows the structure of a loop-type optical communication network in which the optical semiconductor device of this invention is used as an amplifying apparatus. In this embodiment, there are four transceivers and the optical signal is transmitted in a clockwise direction in the loop network. In FIG. 16, the reference numerals 701–704 are transceivers for connecting terminals to the network, reference numerals 705–712 are optical fibers, reference numerals 713–716 are transmitters for converting the electric signal to the optical signal to transmit it to the network, reference numerals 717–720 are receivers for converting the optical signal input from the network to the electric signal, and reference numerals 721–732 are optical amplifiers of this invention for directly amplifying the optical signal. The optical amplifiers 721–732 are classified into booster amplifiers 721–724 of the transmitters 713–716, pre-amplifiers 725–728 of the receivers 717–720 and repeater amplifiers 729–732 in the optical transmission line.

Next, the operation of this embodiment will be explained, assuming that the communication is conducted from the transceiver 701 to the transceiver 703. The electric signal is converted to the optical signal in the transmitter 713 of the transceiver 701, and is amplified by the optical amplifier 721 to be transmitted to the optical fiber 705 in the network. This optical signal is amplified by the optical amplifier 729, transmitted through the optical fiber 706, amplified by the optical amplifier 726 to the transceiver 702 and converted to the electric signal in the receiver 718. Since this signal is addressed to the transceiver 703, the signal is addressed to the transceiver 703, the signal is converted to the optical signal in the transmitter 714 of the transceiver 702 and this light signal is amplified by the optical amplifier 722 to be input into the optical fiber 707 in the network. This optical signal is amplified by the optical amplifier 730, transmitted through the optical fiber 708, amplified by the optical amplifier 727 of the end office 703, and converted to the electric signal in the receiver 719. Since this signal is addressed to the transceiver 703, the transceiver 703 identifies this signal and receives it. Thus, communication is completed.

In this embodiment, there are disposed the optical amplifiers in all the paths in the network along which lights are transmitted, but it is possible to dispose the optical amplifier in part of the paths in the network. Further, this embodiment is an active type in which the signal in the transceiver is regenerated and repeated. But, it is possible to construct a passive-type system in which the optical branch-combine device is used to connect the transceiver to the optical fiber which is the transmission line.

In the above-mentioned embodiments of FIGS. 9–16, an optical semiconductor device of the present invention is used as a light amplifier, but the device of the present invention may be used as a laser light source of a light transmitter in an optical communication system.

While there has been shown and described what are considered preferred embodiments of the present invention, it will be obvious to those skilled in the art that various changes and modifications may be made therein without departing from the inventions as defined by the claims.

We claim:

1. An optical semiconductor device with wavelength selectivity comprising:
   a substrate;
   a collector layer provided on said substrate and composed of a semiconductor having a first conductive type;
   a multiple quantum well layer provided on said collector layer;
   a base layer provided on said multiple quantum well layer and composed of a semiconductor having a second conductive type, said base layer consisting of an active layer, and first and second semiconductor layers with said active layer sandwiched therebetween and having a wider band gap than said active layer, said base layer and said multiple quantum well layer propagating light;
   an emitter layer provided on said base layer and composed of a semiconductor having the first conductive type; and
   a collector electrode, a base electrode and an emitter electrode electrically connected to said collector layer, said base layer and said emitter layer, respectively.

2. The optical semiconductor device with wavelength selectivity according to claim 1, further comprising a Fabry-Perot resonator for resonating the light propagating through said base layer and said multiple quantum well layer.

3. The optical semiconductor device with wavelength selectivity according to claim 1, further comprising a grating for distributed-feedbacking the light propagating through said base layer and said multiple quantum well layer.

4. The optical semiconductor device with wavelength selectivity according to claim 3, wherein said grating is formed in a third semiconductor layer provided between said base layer and said emitter layer.

5. The optical semiconductor device with wavelength selectivity according to claim 1, wherein said multiple quantum well layer is formed of a plurality of well layers consisting of an undoped intrinsic semiconductor and a plurality of barrier layers consisting of an undoped intrinsic semiconductor which are alternately laminated.

6. The optical semiconductor device with wavelength selectivity according to claim 5, wherein said well layers and said barrier layers consist of AlGaAs having different Al mixed crystal ratios.

7. The optical semiconductor device with wavelength selectivity according to claim 5, wherein said each well layer has a thickness of 70 to 120 Å.

8. The optical semiconductor device with wavelength selectivity according to claim 1, wherein an excitor wavelength of said multiple quantum well layer is shorter by about 100 to 150 Å than the wavelength of light propagating therethrough.

9. The optical semiconductor device with wavelength selectivity according to claim 1, wherein said collector layer and said emitter layer consist of p-AlGaAs, and said base layer consists of n-AlGaAs.

10. The optical semiconductor device with wavelength selectivity according to claim 1, wherein said collector layer and said emitter layer consist of n-AlGaAs, and said base layer consists of p-AlGaAs.

11. The optical semiconductor device with wavelength selectivity according to claim 1, wherein said emitter layer is formed with a stripe-like ridge extending along a propagating direction of light.

12. The optical semiconductor device with wavelength selectivity according to claim 1, wherein said active layer has a single quantum well structure.

13. An optical semiconductor device according to claim 1, wherein the optical semiconductor device is adapted for use in a communication system comprising a transmitter, a receiver, a transmission line for connecting said transmitter and receiver, and an optical amplifying apparatus including the optical semiconductor device, and wherein the optical semiconductor device is disposed in at least one location of said transmitter and receiver.

14. An optical semiconductor device according to claim 1, wherein the optical semiconductor device is adapted for use in a communication system comprising a transmitter, a receiver, a repeater equipment, a transmission line for connecting said transmitter and receiver through said repeater equipment, and an optical amplifying apparatus including the optical semiconductor device, and wherein the optical semiconductor device is disposed in at least one location of said transmitter and receiver and said repeater equipment.

15. An optical semiconductor device according to claim 1, wherein the optical semiconductor device is adapted for use in a bidirectional optical communication system comprising a plurality of transceivers, a transmission line for connecting said transceivers and an optical amplifying apparatus including the optical semiconductor device, and wherein the optical semiconductor device is disposed in at least one location of said transceivers.

16. An optical semiconductor device according to claim 1, wherein the optical semiconductor device is adapted for use in a bidirectional optical communication system comprising a plurality of transceivers, a repeater equipment, a transmission line for connecting said transceivers through said repeater equipment, and an optical amplifying apparatus including the optical semiconductor device, and wherein the optical semiconductor device is disposed in at least one location of said transceivers and said repeater equipment.

17. An optical semiconductor device according to claim 1, wherein the optical semiconductor device is adapted for use in a bus-type optical communication network comprising a plurality of terminals, a plurality of transceivers respectively connected to said terminals to perform optical communication among said terminals, at least one transmission line for connecting said transceivers and an optical amplifying apparatus including the optical semiconductor device, and wherein the optical semiconductor device is disposed in at least one location on a light transmitting path from a light transmit part of any one of said transceivers to a light receive part of any one of said transceivers.

18. An optical semiconductor device according to claim 1, wherein the optical semiconductor device is adapted for use in an active bus-type optical communication network comprising a plurality of terminals, a plurality of optical nodes each of which includes, at least, plural means for transmitting a light signal, plural means for receiving a light signal and means for controlling communication, a transmission line for connecting said optical nodes, and an optical amplifying apparatus including the optical semiconductor device, and wherein the optical semiconductor device is disposed in at least one location on a light transmitting path from said light signal transmitting means in any one of said optical nodes to said light signal receiving means in any one of said optical nodes.

19. An optical semiconductor device according to claim 1, wherein the optical semiconductor device is adapted for use in a star-type optical communication network comprising a plurality of transceivers each of which includes a light transmit part and a light receive part, a star coupler, a transmission line for connecting said star coupler to said transceivers, and an optical amplifying apparatus including the optical semiconductor device, and wherein the optical semiconductor device is disposed in at least one location on a light transmitting path.

20. An optical semiconductor device according to claim 1, wherein the optical semiconductor device is adapted for use in a loop-type optical communication network comprising a plurality of transceivers each of which includes a light transmit part and a light receive part, a transmission line for connecting said transceivers, and an optical amplifying apparatus including the optical semiconductor device, and wherein the optical semiconductor device is disposed in at least one location on a light transmitting path.

21. A method of amplifying a light of selected wavelength using an optical semiconductor device having a substrate, a collector layer provided on said substrate and composed of a semiconductor having a first conductive type, a multiple quantum well layer provided on said collector layer, a base layer provided on said multiple quantum well layer and composed of a semiconductor having a second conductive type, said base layer consisting of an active layer, and first and second semiconductor layers with said active layer sandwiched therebetween and having a wider band gap than said active layer, an emitter layer provided on said base layer and composed of a semiconductor having the first conductive type, and a collector electrode, a base electrode and an emitter electrode electrically connected to said collector layer, said base layer and said emitter layer, respectively, the method comprising steps of:
  entering light into a waveguide constituted of said multiple quantum well layer and said base layer;
  propagating the light through the waveguide;
  amplifying a light of selected wavelength from among the light propagating through the waveguide by applying an electric field of forward bias between said emitter electrode and said base electrode;
  emitting the amplified light from the device; and
  changing the wavelength of said amplified light by applying an electric field of reverse bias between said base electrode and said collector electrode.

22. The method according to claim 21, wherein said base layer and said multiple quantum well layer constitute a Fabry-Perot resonator, the light of selected wavelength being amplified by resonation within said Fabry-Perot resonator.

23. The method according to claim 21, wherein said optical semiconductor device further comprises a grating, the light of selected wavelength being amplified with distributed-feedback at said grating.

24. A method of emitting a laser beam of selected wavelength from an optical semiconductor device having a substrate, a collector layer provided on said substrate and composed of a semiconductor having a first conductive type, a multiple quantum well layer provided on said collector layer, a base layer provided on said multiple quantum well layer and composed of a semiconductor having a second conductive type, said base layer consisting of an active layer, and first and second semiconductor layers with said active layer sandwiched therebetween and having a wider band gap than said active layer, said multiple quantum well layer and said base layer constituting a laser resonator, an emitter layer provided on said base layer and composed of a semiconductor having the first conductive type, and a collector electrode, a base electrode and an emitter electrode electrically connected to said collector layer, said base layer and said emitter layer, respectively, the method comprising steps of:
  emitting a laser beam of selected wavelength from the device by applying an electric field of forward bias between said emitter electrode and said base electrode, and supplying a current to said active layer; and
  changing the wavelength of said laser beam emitted therefrom by applying an electric field of reverse bias between said base electrode and said collector electrode.

25. An optical semiconductor device with wavelength selectivity comprising:
  a substrate;
  a collector layer provided on said substrate and composed of a semiconductor having a first conductive type;
  a multiple quantum well layer provided on said collector layer;
  a base layer provided on said multiple quantum well layer and composed of a semiconductor having a second conductive type, said base layer consisting of an active layer and first and second semiconductor layers with said active layer sandwiched therebetween and having a wider band gap than said active layer, said base layer and said multiple quantum well layer propagating light;

an emitter layer provided on said base layer and composed of a semiconductor having the first conductive type;

a collector electrode, a base electrode and an emitter electrode electrically connected to said collector layer, said base layer and said emitter layer, respectively;

a first power source for applying an electric field of forward bias between said emitter electrode and said base electrode; and a second power source for applying an electric field of reverse bias between said base electrode and said collector electrode.

26. The optical semiconductor device with wavelength selectivity according to claim 25, further comprising a Fabry-Perot resonator for resonating the light propagating through said base layer and said multiple quantum well layer.

27. The optical semiconductor device with wavelength selectivity according to claim 25, further comprising a grating for distributed-feedbacking the light propagating through said base layer and said multiple quantum well layer.

28. The optical semiconductor device with wavelength selectivity according to claim 27, wherein said grating is formed in a third semiconductor layer provided between said base layer and said emitter layer.

29. The optical semiconductor device with wavelength selectivity according to claim 25, wherein said multiple quantum well layer is formed of a plurality of well layers consisting of an undoped intrinsic semiconductor and a plurality of barrier layers consisting of an undoped intrinsic semiconductor which are alternately laminated.

30. The optical semiconductor device with wavelength selectivity according to claim 29, wherein said well layers and said barrier layers consist of AlGaAs having different Al mixed crystal ratios.

31. The optical semiconductor device with wavelength selectivity according to claim 29, wherein said each well layer has a thickness of 70 to 120 Å.

32. The optical semiconductor device with wavelength selectivity according to claim 25, wherein an exciton wavelength of said multiple quantum well layer is shorter by about 100 to 150 Å than the wavelength of light propagating therethrough.

33. The optical semiconductor device with wavelength selectivity according to claim 25, wherein said collector layer and said emitter layer consist of p-AlGaAs, and said base layer consists of n-AlGaAs.

34. The optical semiconductor device with wavelength selectivity according to claim 25, wherein said collector layer and said emitter layer consist of n-AlGaAs, and said base layer consists of p-AlGaAs.

35. The optical semiconductor device with wavelength selectivity according to claim 25, wherein said emitter layer is formed with a stripe-like ridge extending along a propagating direction of light.

36. The optical semiconductor device with wavelength selectivity according to claim 25, wherein said active layer has a single quantum well structure.

37. An optical semiconductor device with wavelength selectivity comprising:

a substrate;

a semiconductor active layer provided on said substrate and having a first conductive type;

first and second semiconductor layers with said active layer sandwiched therebetween and having the first conductive type with a wider band gap than said active layer;

a multiple quantum well layer provided adjacent to said first semiconductive layer, wherein said active layer, said multiple quantum well layer and said first and second semiconductor layers constitute an optical waveguide;

third and fourth semiconductive layers with said optical waveguide sandwiched therebetween and having a second conductive type; and a first electrode, a second electrode and a third electrode electrically connected to said second semiconductor layer, said third semiconductor layer and said fourth semiconductor layer, respectively.

38. The optical semiconductor device with wavelength selectivity according to claim 37, further comprising a Fabry-Perot resonator for resonating the light propagating through said optical waveguide.

39. The optical semiconductor device with wavelength selectivity according to claim 37, further comprising a grating for distributed-feedbacking the light propagating through said optical waveguide.

40. The optical semiconductor device with wavelength selectivity according to claim 39, wherein said grating is formed in a fifth semiconductor layer provided between said second semiconductive layer and said fourth semiconductive layer.

41. The optical semiconductor device with wavelength selectivity according to claim 37, wherein said multiple quantum well layer is formed of a plurality of well layers consisting of an undoped intrinsic semiconductor and a plurality of barrier layers consisting of an undoped intrinsic semiconductor which are alternately laminated.

42. The optical semiconductor device with wavelength selectivity according to claim 41, wherein said well layers and said barrier layers consist of AlGaAs having different Al mixed crystal ratios.

43. The optical semiconductor device with wavelength selectivity according to claim 41, wherein said each well layer has a thickness of 70 to 120 Å.

44. The optical semiconductor device with wavelength selectivity according to claim 37, wherein an exciton wavelength of said multiple quantum well layer is shorter by about 100 to 150 Å than the wavelength of the light propagating through the optical waveguide.

45. The optical semiconductor device with wavelength selectivity according to claim 37, wherein said active layer and said first and second semiconductive layers consist of n-AlGaAs, and said third and fourth semiconductive layers consist of p-AlGaAs.

46. The optical semiconductor device with wavelength selectivity according to claim 37, wherein said active layer and said first and second semiconductive layers consist of n-AlGaAs, and said third and fourth semiconductive layers consist of n-AlGaAs.

47. The optical semiconductor device with wavelength selectivity according to claim 37, wherein said fourth semiconductive layer is formed with a stripe-like ridge extending along a propagating direction of light.

48. The optical semiconductor device with wavelength selectivity according to claim 37, wherein said active layer has a single quantum well structure.

49. An optical semiconductor device according to claim 37, wherein the optical semiconductor device is adapted for use in an optical communication system comprising a transmitter, a receiver, a transmission line for connecting said transmitter and receiver, and an optical amplifying apparatus including the optical semiconductor device, and wherein the semiconductor device is disposed in at least one location of said transmitter and receiver.

50. An optical semiconductor device according to claim 37, wherein the optical semiconductor device is adapted for use in an optical communication system comprising a transmitter, a receiver, a repeater equipment, a transmission line for connecting said transmitter and receiver through said repeater equipment, and an optical amplifying apparatus including the optical semiconductor device, and wherein the semiconductor device is disposed in at least one location of said transmitter and receiver and said repeater equipment.

51. An optical semiconductor device according to claim 37, wherein the optical semiconductor device is adapted for use in a bidirectional optical communication system comprising a plurality of transceivers, a transmission line for connecting said transceivers and an optical amplifying apparatus including the optical semiconductor device, and wherein the semiconductor device is disposed in at least one location of said transceivers.

52. An optical semiconductor device according to claim 37, wherein the optical semiconductor device is adapted for use in a bidirectional optical communication system comprising a plurality of transceivers, a repeater equipment, a transmission line for connecting said transceivers through said repeater equipment, and an optical amplifying apparatus including the optical semiconductor device, and wherein the semiconductor device is disposed in at least one location of said transceivers and said repeater equipment.

53. An optical semiconductor device according to claim 37, wherein the optical semiconductor device is adapted for use in a bus-type optical communication network comprising a plurality of terminals, a plurality of transceivers respectively connected to said terminals to perform optical communication among said terminals, at least one transmission line for connecting said transceivers, and an optical amplifying apparatus including the optical semiconductor device, and wherein the semiconductor device is disposed in at least one location on a light transmitting path from a light transmit part of any one of said transceivers to a light receive part of any one of said transceivers.

54. An optical semiconductor device according to claim 37, wherein the optical semiconductor device is adapted for use in an active bus-type optical communication network comprising a plurality of terminals; a plurality of optical nodes each of which includes, at least, plural means for transmitting a light signal, plural means for receiving a light signal and means for controlling communication; a transmission line for connecting said optical nodes; and an optical amplifying apparatus including the optical semiconductor device, and wherein the semiconductor device is disposed in at least one location on a light transmitting path from said light signal transmitting means in any one of said optical nodes to said light signal receiving means in any one of said optical nodes.

55. An optical semiconductor device according to claim 37, wherein the optical semiconductor device is adapted for use in a star-type optical communication network comprising a plurality of transceivers each of which includes a light transmit part and a light receive part, a star coupler, a transmission line for connecting said star coupler to said transceivers, and an optical amplifying apparatus including the optical semiconductor device, and wherein the semiconductor device is disposed in at least one location on a light transmitting path.

56. An optical semiconductor device according to claim 37, wherein the optical semiconductor device is adapted for use in a loop-type optical communication network comprising a plurality of transceivers each of which includes a light transmit part and a light receive part, a transmission line for connecting said transceivers, and an optical amplifying apparatus including the optical semiconductor device, and wherein the semiconductor device is disposed in at least one location on a light transmitting path.

57. A method of amplifying a light of selected wavelength using an optical semiconductor device having a substrate, a semiconductor active layer provided on said substrate and having a first conductive type, first and second semiconductor layers with said active layer sandwiched therebetween and having the first conductive type with a wider band gap than said active layer, a multiple quantum well layer provided adjacent to said first semiconductive layer, wherein said active layer, said multiple quantum well layer and said first and second semiconductor layers constitute an optical waveguide, third and fourth semiconductive layers with said optical waveguide sandwiched therebetween and having a second conductive type, and a first electrode, a second electrode and a third electrode electrically connected to said second semiconductor layer, said third semiconductor layer and said fourth semiconductor layer, respectively, the method comprising steps of:
  entering light into the optical waveguide;
  propagating the light through the waveguide;
  amplifying a light of selected wavelength from among the light propagating through the waveguide by applying an electric field of forward bias between the first electrode and the third electrode;
  emitting the amplified light from the device; and
  changing the wavelength of said amplified light by applying an electric field of reverse bias between the first electrode and the second electrode.

58. The optical semiconductor device with wavelength selectivity according to claim 57, wherein said optical waveguide constitutes a Fabry-Perot resonator and the light of selected wavelength is amplified by the resonation within said resonator.

59. The optical semiconductor device with wavelength selectivity according to claim 57, wherein said optical semiconductor device further comprises a grating by which the light of selected wavelength is amplified with the distributed-feedback.

60. A method of emitting a laser beam of selected wavelength from an optical semiconductor device having a substrate, a semiconductor active layer provided on said substrate and having a first conductive type, first and second semiconductor layers with said active layer sandwiched therebetween and having the first conductive type with a wider band gap than said active layer, a multiple quantum well layer provided adjacent to said first semiconductive layer, wherein said active layer, said multiple quantum well layer and said first and second semiconductor layers constitute an optical waveguide containing a laser resonator, third and fourth semiconductive layers with said optical waveguide sandwiched therebetween and having a second conductive type, and a first electrode, a second electrode and a third electrode electrically connected to said second semiconductor layer, said third semiconductor layer and said fourth semiconductor layer, respectively, the method comprising steps of:

emitting a laser beam of selected wavelength from the device by applying an electric field of forward bias between the first electrode and the third electrode, and supplying a current to the active layer; and changing the wavelength of said laser beam emitted from said device by applying an electric field of reverse bias between the first electrode and the second electrode.

61. An optical semiconductor device with wavelength selectivity comprising:

a substrate;

a semiconductor active layer provided on said substrate and having a first conductive type;

first and second semiconductor layers with said active layer sandwiched therebetween and having the first conductive type with a wider band gap than said active layer;

a multiple quantum well layer provided adjacent to said first semiconductive layer, wherein said active layer, said multiple quantum well layer and said first and second semiconductor layers constitute an optical waveguide;

third and fourth semiconductive layers with said optical waveguide sandwiched therebetween and having a second conductive type;

a first electrode, a second electrode and a third electrode electrically connected to said second semiconductor layer, said third semiconductor layer and said fourth semiconductor layer, respectively;

a first power source for applying an electric field of forward bias between said first and third electrodes; and a second power source for applying an electric field of reverse bias between said first and second electrodes.

62. The optical semiconductor device with wavelength selectivity according to claim 61, further comprising a Fabry-Perot resonator for resonating the light propagating through said optical waveguide.

63. The optical semiconductor device with wavelength selectivity according to claim 61, further comprising a grating for distributed-feedbacking the light propagating through said optical waveguide.

64. The optical semiconductor device with wavelength selectivity according to claim 63, wherein said grating is formed in a fifth semiconductor layer provided between said second semiconductive layer and said fourth semiconductive layer.

65. The optical semiconductor device with wavelength selectivity according to claim 61, wherein said multiple quantum well layer is formed of a plurality of well layers consisting of an undoped intrinsic semiconductor and a plurality of barrier layers consisting of an undoped intrinsic semiconductor which are alternately laminated.

66. The optical semiconductor device with wavelength selectivity according to claim 65, wherein said well layers and said barrier layers consist of AlGaAs having different Al mixed crystal ratios.

67. The optical semiconductor device with wavelength selectivity according to claim 65, wherein said each well layer has a thickness of 70 to 120 Å.

68. The optical semiconductor device with wavelength selectivity according to claim 61, wherein an exciton wavelength of said multiple quantum well layer is shorter by about 100 to 150 Å than the wavelength of the light propagating through the optical waveguide.

69. The optical semiconductor device with wavelength selectivity according to claim 61, wherein said active layer and said first and second semiconductive layers consist of n-AlGaAs, and said third and fourth semiconductive layers consist of p-AlGaAs.

70. The optical semiconductor device with wavelength selectivity according to claim 61, wherein said active layer and said first and second semiconductive layers consist of p-AlGaAs, and said third and fourth semiconductive layers consist of n-AlGaAs.

71. The optical semiconductor device with wavelength selectivity according to claim 61, wherein said fourth semiconductive layer is formed with a stripe-like ridge extending along a propagating direction of light.

72. The optical semiconductor device with wavelength selectivity according to claim 61, wherein said active layer has a single quantum well structure.

* * * * *

UNITED STATES PATENT AND TRADEMARK OFFICE
CERTIFICATE OF CORRECTION

PATENT NO. : 5,334,854
DATED : August 2, 1994
INVENTOR(S) : Ono et al.

It is certified that error appears in the above-indentified patent and that said Letters Patent is hereby corrected as shown below:

[56] References Cited

FOREIGN PATENT DOCUMENTS

"2296066 12/1988 European Patent Office" should be deleted;
"2360011 3/1990 European Patent Office" should be deleted;
"2404551 6/1990 European Patent Office" should be deleted; and
"6470724 3/1989 Japan" should be deleted.

OTHER PUBLICATIONS

"Quadratic . . . etc." "Lett. 50(13)" should read --Lett., Vol. 50(13),--.

Column 5

Line 60, "hereto" should read --hetero--.

Column 8

Line 62, "that" should read --that of--.

Column 9

Line 1, "a" should be deleted; and
Line 2, "side," should read --side.--.

UNITED STATES PATENT AND TRADEMARK OFFICE
CERTIFICATE OF CORRECTION

PATENT NO. : 5,334,854
DATED : August 2, 1994
INVENTOR(S) : Ono et al.

It is certified that error appears in the above-indentified patent and that said Letters Patent is hereby corrected as shown below:

Column 24

Line 46, "the" (second occurrence) should be deleted.

Column 25

Line 17, "semiconductor" should read --semiconductive--;
    Line 24, "semiconductor" should read --semiconductive--;
    Lines 30 and 31, "semiconductor" should read --semiconductive--;
    Line 31 (second occurrence), "semiconductor" should read --semiconductive--; and
    Line 32, "semiconductor" should read --semiconductive--.

Column 26

Line 5, "semiconductor" should read --semiconductive--.

Signed and Sealed this

Ninth Day of May, 1995

Attest:

BRUCE LEHMAN

Attesting Officer    Commissioner of Patents and Trademarks